(12) United States Patent
Kimura et al.

(10) Patent No.: US 10,089,923 B2
(45) Date of Patent: *Oct. 2, 2018

(54) ELECTRIC CIRCUIT

(71) Applicant: Semiconductor Energy Laboratory Co., Ltd., Atsugi-shi, Kanagawa-ken (JP)

(72) Inventors: Hajime Kimura, Kanagawa (JP); Yasuko Watanabe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 102 days.

This patent is subject to a terminal disclaimer.

(21) Appl. No.: 15/231,834

(22) Filed: Aug. 9, 2016

(65) Prior Publication Data

US 2016/0351117 A1 Dec. 1, 2016

Related U.S. Application Data

(63) Continuation of application No. 14/475,611, filed on Sep. 3, 2014, now Pat. No. 9,419,570, which is a
(Continued)

(30) Foreign Application Priority Data

Nov. 28, 2001 (JP) .................. 2001-363484

(51) Int. Cl.
*H03B 1/00* (2006.01)
*H03K 3/00* (2006.01)
(Continued)

(52) U.S. Cl.
CPC ......... *G09G 3/3225* (2013.01); *G09G 3/3648* (2013.01); *H01L 27/0629* (2013.01);
(Continued)

(58) Field of Classification Search
CPC ............... G09G 3/3688; G09G 3/3648; G09G 2330/021; G09G 2310/027; G09G 5/006
(Continued)

(56) References Cited

U.S. PATENT DOCUMENTS

| 4,577,162 A | 3/1986 | Peterson |
| 4,694,341 A | 9/1987 | Soneda et al. |

(Continued)

FOREIGN PATENT DOCUMENTS

| EP | 0190973 B | 8/1986 |
| EP | 0899714 A | 3/1999 |

(Continued)

OTHER PUBLICATIONS

Goh.J et al., "A New Poly-Si TFT Pixel Circuit Scheme for an Active-Matrix Organic Light Emitting Diode Displays", Asia Display / IDW '01, 2001, pp. 319-322.
(Continued)

*Primary Examiner* — Quan Tra
(74) *Attorney, Agent, or Firm* — Fish & Richardson P.C.

(57) ABSTRACT

A transistor has variation in a threshold voltage or mobility due to accumulation of factors such as variation in a gate insulating film which is caused by a difference of a manufacturing process or a substrate to be used and variation in a crystal state of a channel formation region. The present invention provides an electric circuit which is arranged such that both electrodes of a capacitance device can hold a voltage between the gate and the source of a specific transistor. Further, the present invention provides an electric circuit which has a function capable of setting a potential difference between both electrodes of a capacitance device so as to be a threshold voltage of a specific transistor.

11 Claims, 23 Drawing Sheets

Related U.S. Application Data continuation of application No. 14/023,516, filed on Sep. 11, 2013, now Pat. No. 8,841,941, which is a continuation of application No. 13/784,876, filed on Mar. 5, 2013, now Pat. No. 8,536,937, which is a continuation of application No. 12/822,247, filed on Jun. 24, 2010, now Pat. No. 8,400,191, which is a continuation of application No. 12/041,042, filed on Mar. 3, 2008, now Pat. No. 7,746,157, which is a continuation of application No. 11/197,427, filed on Aug. 5, 2005, now Pat. No. 7,348,825, which is a continuation of application No. 10/304,061, filed on Nov. 26, 2002, now Pat. No. 6,927,618.

(51) Int. Cl.

| | | |
|---|---|---|
| *G09G 3/3225* | (2016.01) | |
| *H03K 19/003* | (2006.01) | |
| *H03K 19/017* | (2006.01) | |
| *H01L 27/06* | (2006.01) | |
| *H03F 3/45* | (2006.01) | |
| *G09G 3/36* | (2006.01) | |

(52) U.S. Cl.
CPC ..... *H03F 3/45076* (2013.01); *H03F 3/45179* (2013.01); *H03K 19/00384* (2013.01); *H03K 19/01728* (2013.01); *G09G 2300/0833* (2013.01); *G09G 2300/0876* (2013.01); *H03F 3/45* (2013.01); *H03F 2203/45112* (2013.01); *H03F 2203/45628* (2013.01)

(58) Field of Classification Search
USPC .............................. 327/108; 345/76, 82, 204
See application file for complete search history.

(56) References Cited

U.S. PATENT DOCUMENTS

| | | | |
|---|---|---|---|
| 5,689,205 A | 11/1997 | Hughes et al. | |
| 5,783,952 A | 7/1998 | Kazazian | |
| 6,114,872 A | 9/2000 | Takahashi | |
| 6,229,506 B1 * | 5/2001 | Dawson | G09G 3/3233 345/82 |
| 6,313,819 B1 | 11/2001 | Maekawa et al. | |
| 6,445,371 B1 | 9/2002 | Miyazawa et al. | |
| 6,538,631 B1 | 3/2003 | Kwon | |
| 6,577,302 B2 | 6/2003 | Hunter et al. | |
| 6,734,636 B2 | 5/2004 | Sanford et al. | |
| 6,768,348 B2 | 7/2004 | Shionoiri et al. | |
| 6,801,186 B2 | 10/2004 | Han et al. | |
| 6,839,057 B2 * | 1/2005 | Iguchi | G09G 3/325 345/204 |
| 6,856,307 B2 | 2/2005 | Osame et al. | |
| 6,862,041 B2 | 3/2005 | Haraguchi | |
| 7,091,750 B2 | 8/2006 | Shionoiri et al. | |
| 7,123,250 B2 | 10/2006 | Kimura et al. | |
| 7,154,466 B2 | 12/2006 | Osame et al. | |
| 7,564,271 B2 | 7/2009 | Shionoiri et al. | |
| 7,710,166 B2 | 5/2010 | Kimura et al. | |
| 7,847,598 B2 | 12/2010 | Shionoiri et al. | |
| 8,149,018 B2 | 4/2012 | Shionoiri et al. | |
| 8,149,043 B2 | 4/2012 | Kimura et al. | |
| 2004/0150607 A1 | 8/2004 | Nakajima et al. | |
| 2012/0133437 A1 | 5/2012 | Shionoiri et al. | |
| 2012/0139440 A1 | 6/2012 | Kimura et al. | |

FOREIGN PATENT DOCUMENTS

| | | |
|---|---|---|
| JP | 61-131171 A | 8/1986 |
| JP | 62-151223 A | 9/1987 |
| JP | 64-000808 A | 1/1989 |
| JP | 03-139908 A | 6/1991 |
| JP | 09-321553 A | 12/1997 |
| JP | 10-065461 A | 3/1998 |
| JP | 11-073165 A | 3/1999 |
| JP | 11-330874 A | 11/1999 |
| JP | 11-340751 A | 12/1999 |
| JP | 2000-013153 A | 1/2000 |
| JP | 2000-347159 A | 12/2000 |
| JP | 2001-083924 A | 3/2001 |
| JP | 2001-085989 A | 3/2001 |
| JP | 2001-211393 A | 8/2001 |
| JP | 2001-306041 A | 11/2001 |

OTHER PUBLICATIONS

Kida.Y et al., "LN-4:A3.8 Inch Half-VGA Transflective Color TFT-LCD With Completely Integrated 6-Bit RGB Parallel Interface Drivers", Eurodisplay '02 : The 22th International Display Research Conference, Oct. 1, 2002, pp. 831-834.
Sekine.H et al., "3.2: Amplifier Compensation Method for a Poly-Si TFT LCLV With an Integrated Data-Driver", Conference Record of the 1997 IDRC (International Display Research Conference), Sep. 15, 1997, pp. 45-48.

* cited by examiner

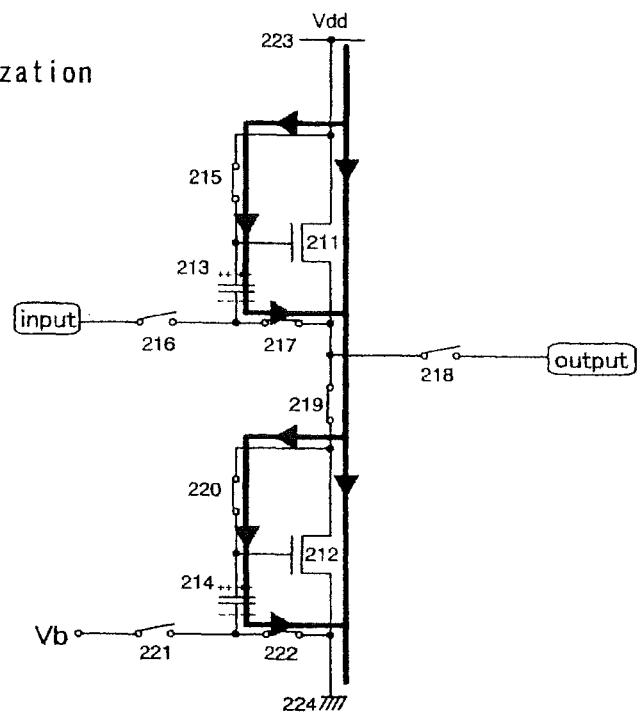
Fig. 1A initialization
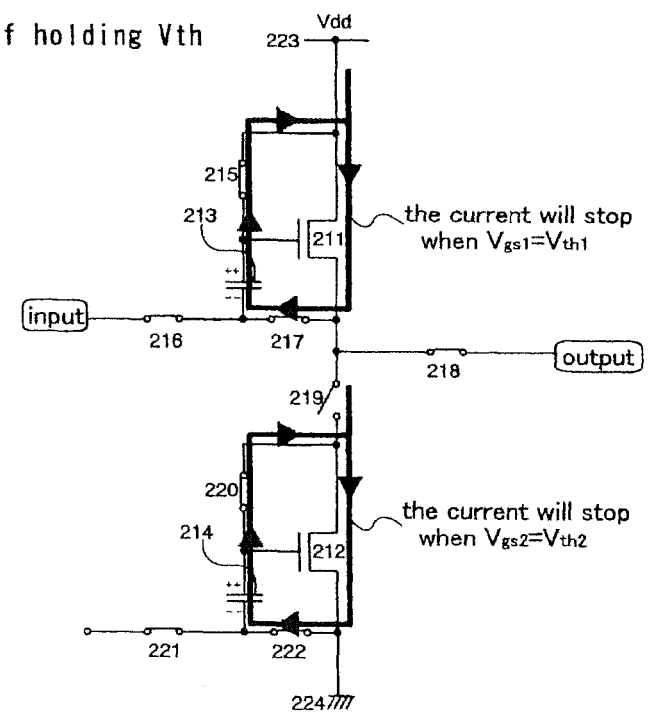
Fig. 1B start of holding Vth

Fig. 2A end of folding Vth
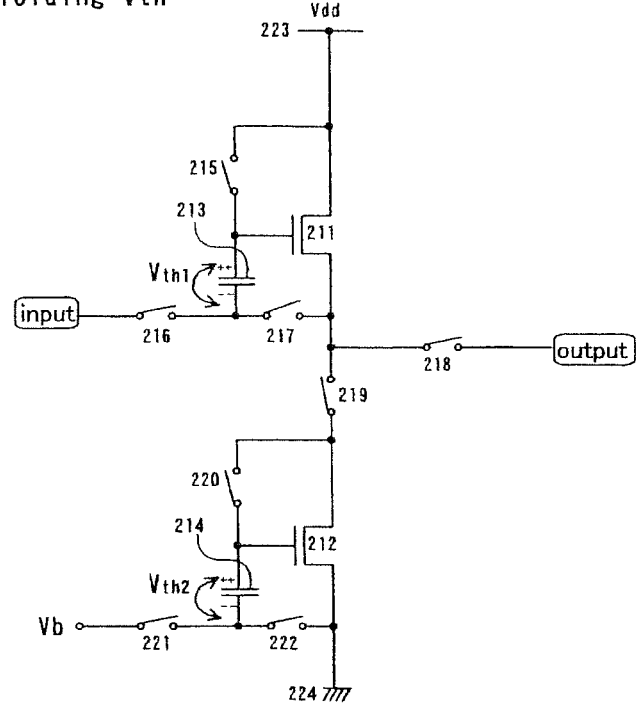
Fig. 2B
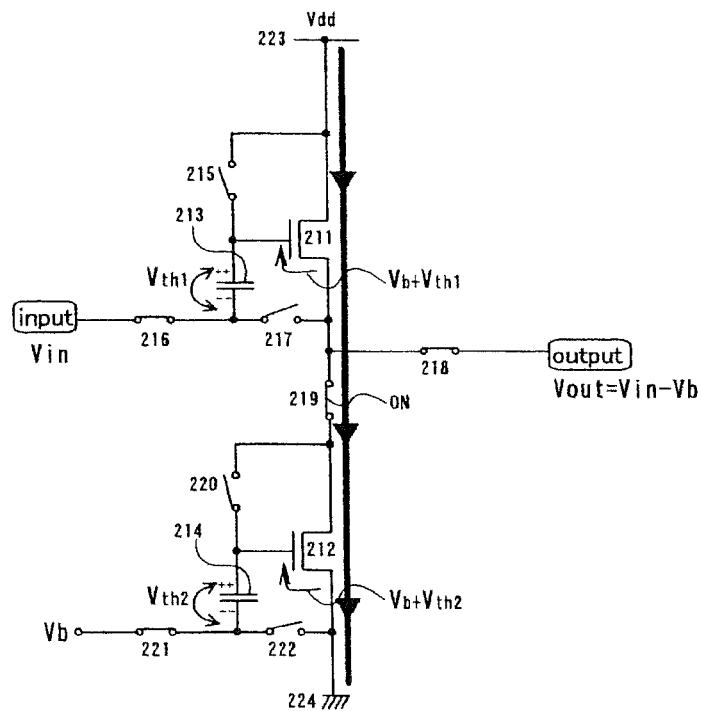

Fig. 5A
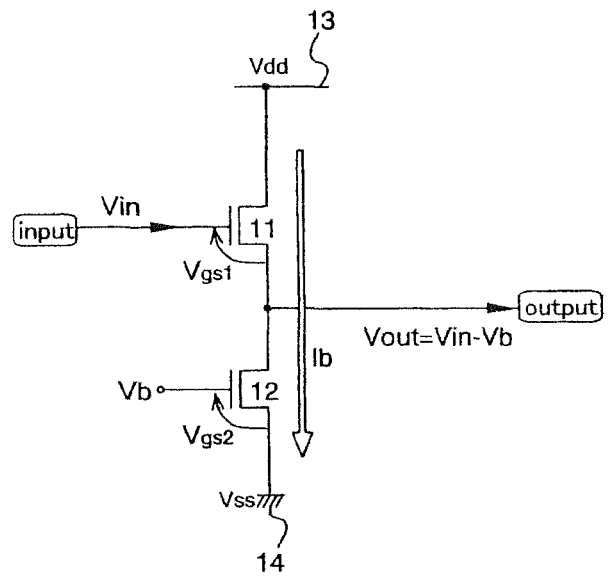
Fig. 5B  $V_{gs1}=V_{gs2}=Vb$
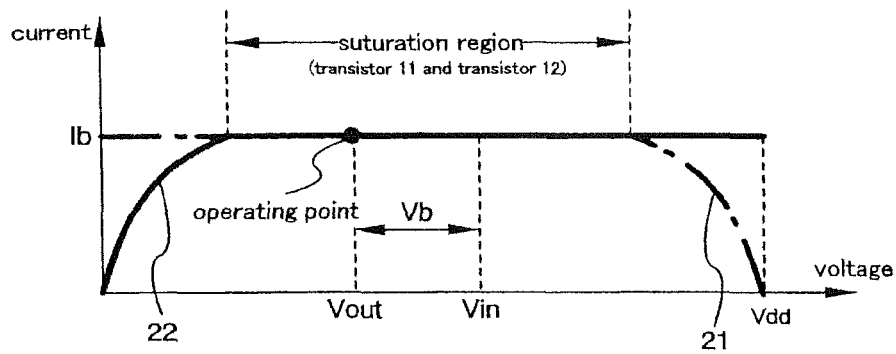
Fig. 5C  $V_{gs2}=Vb, V_{gs1}=Vb'$
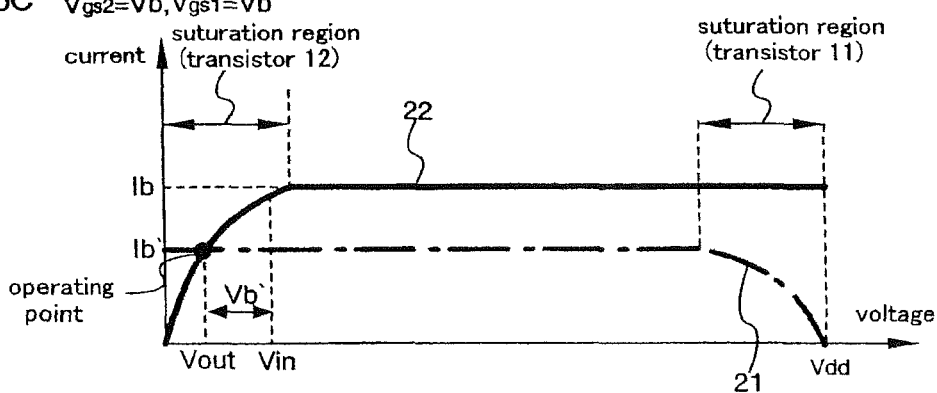

Fig. 6A  Vout<Vin-Vb,t=0
Vout=Vin-Vb,t=t1
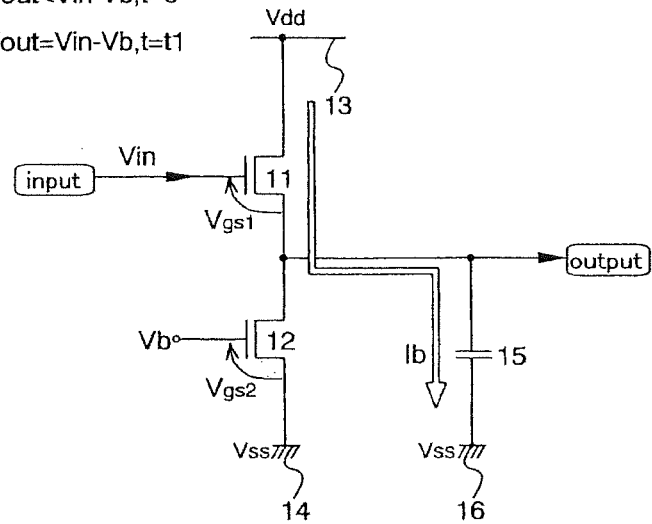
Fig. 6B  Vout>Vin-Vb,t=0
Vout=Vin-Vb,t=t1
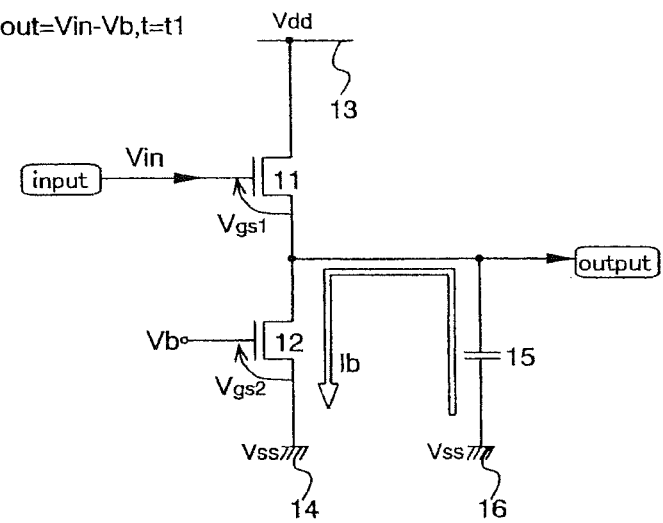

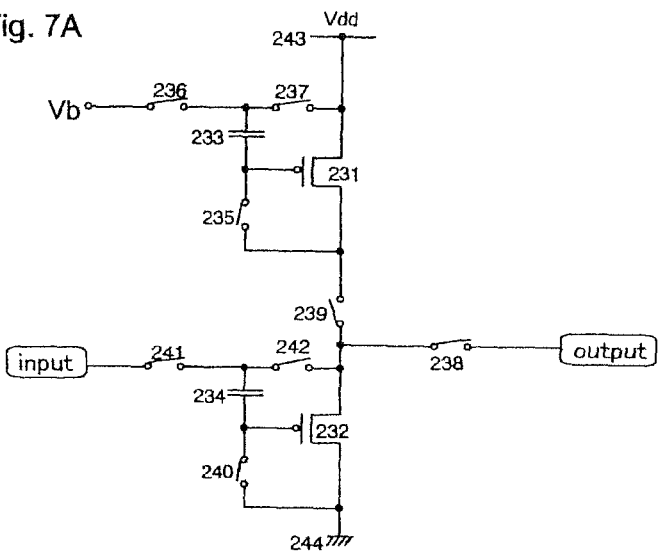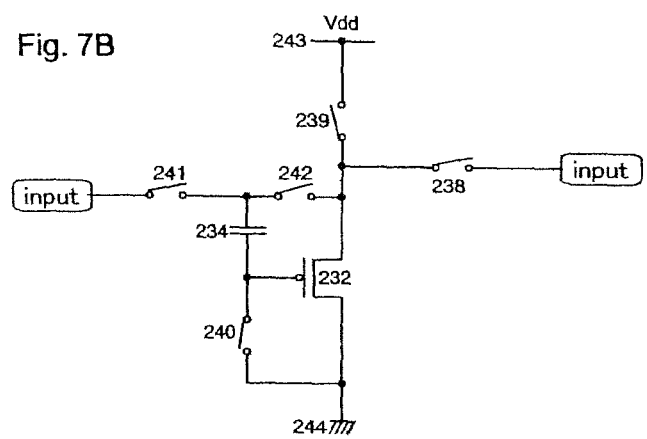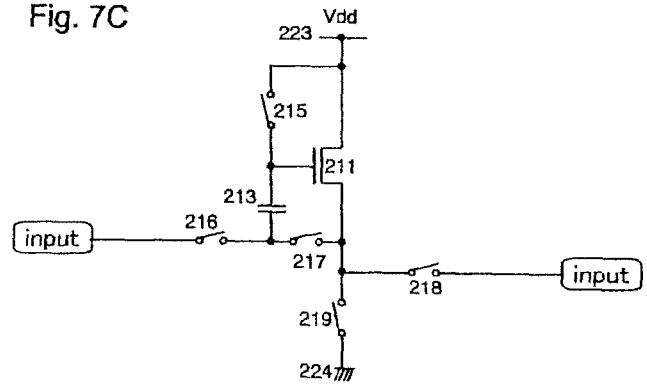

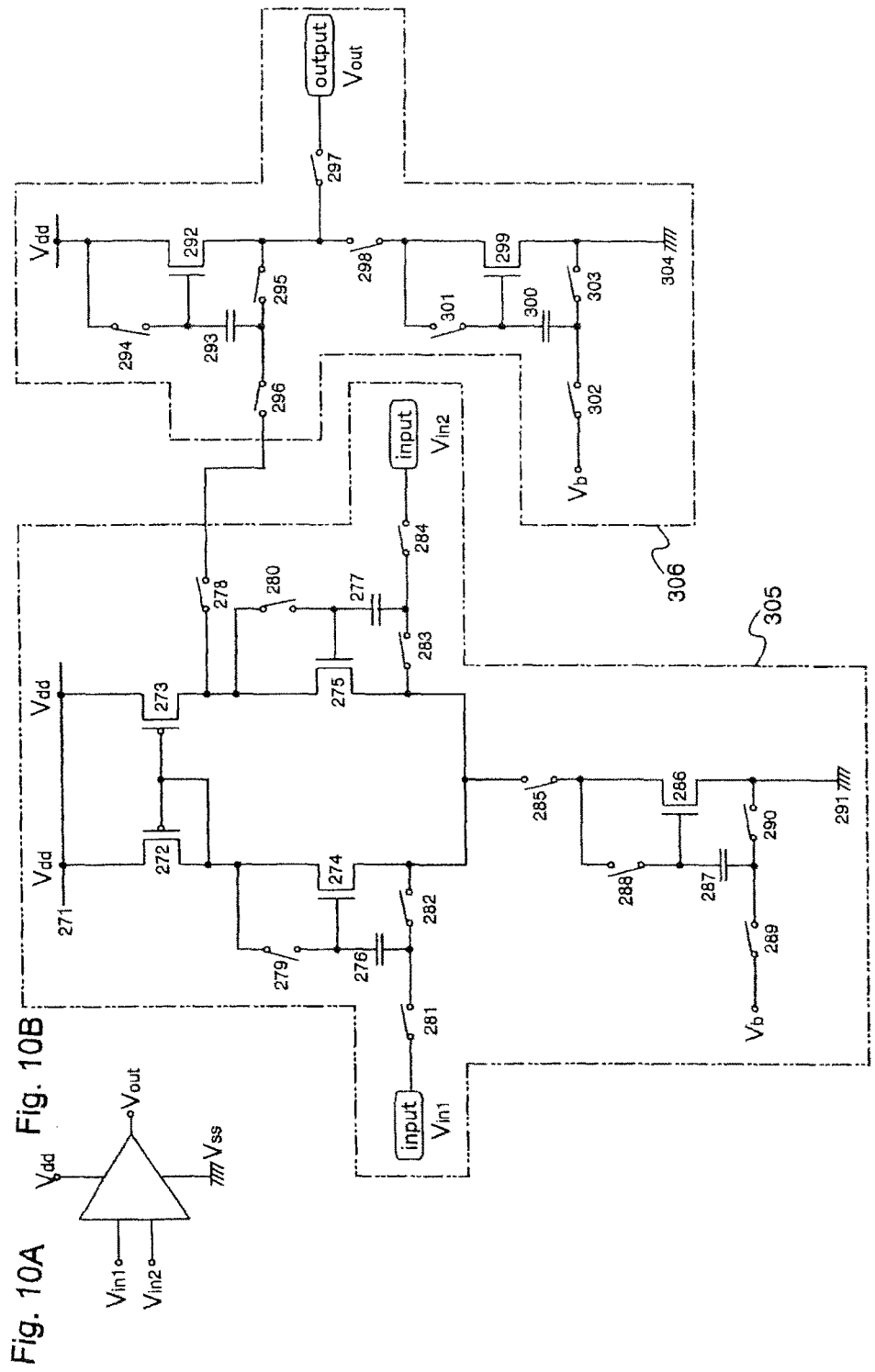

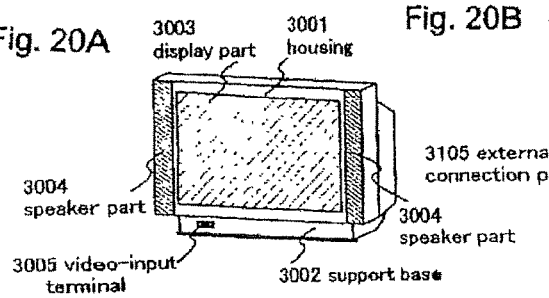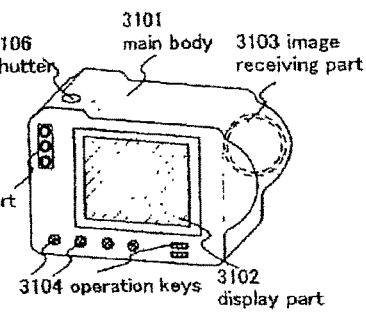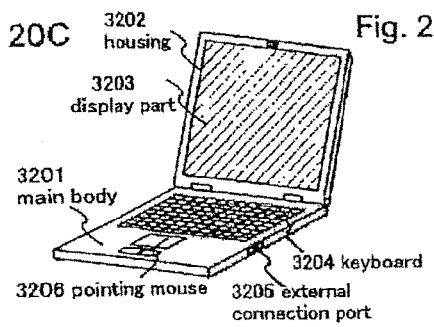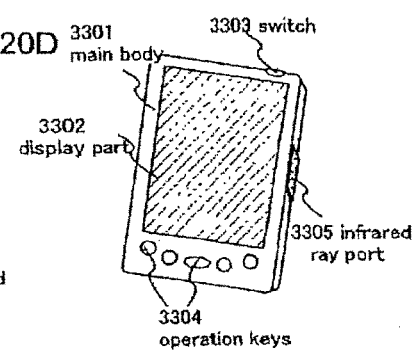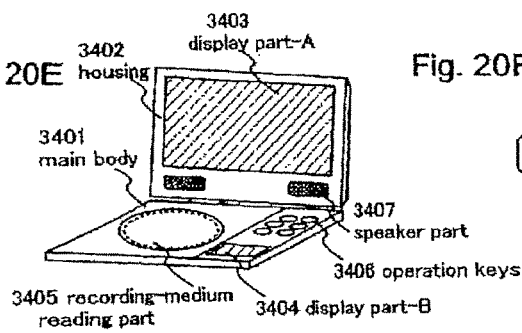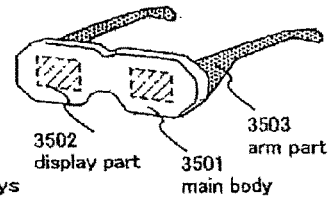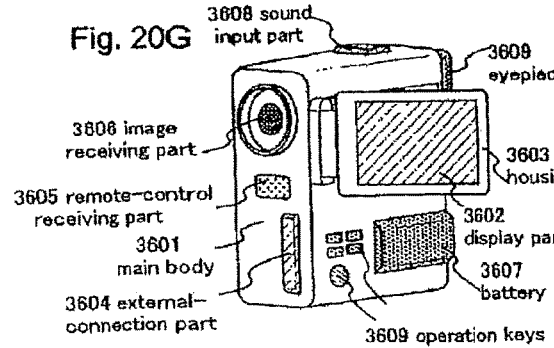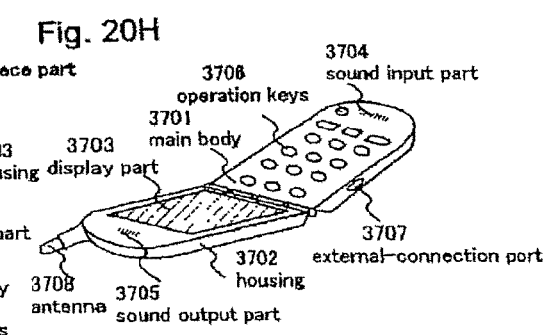

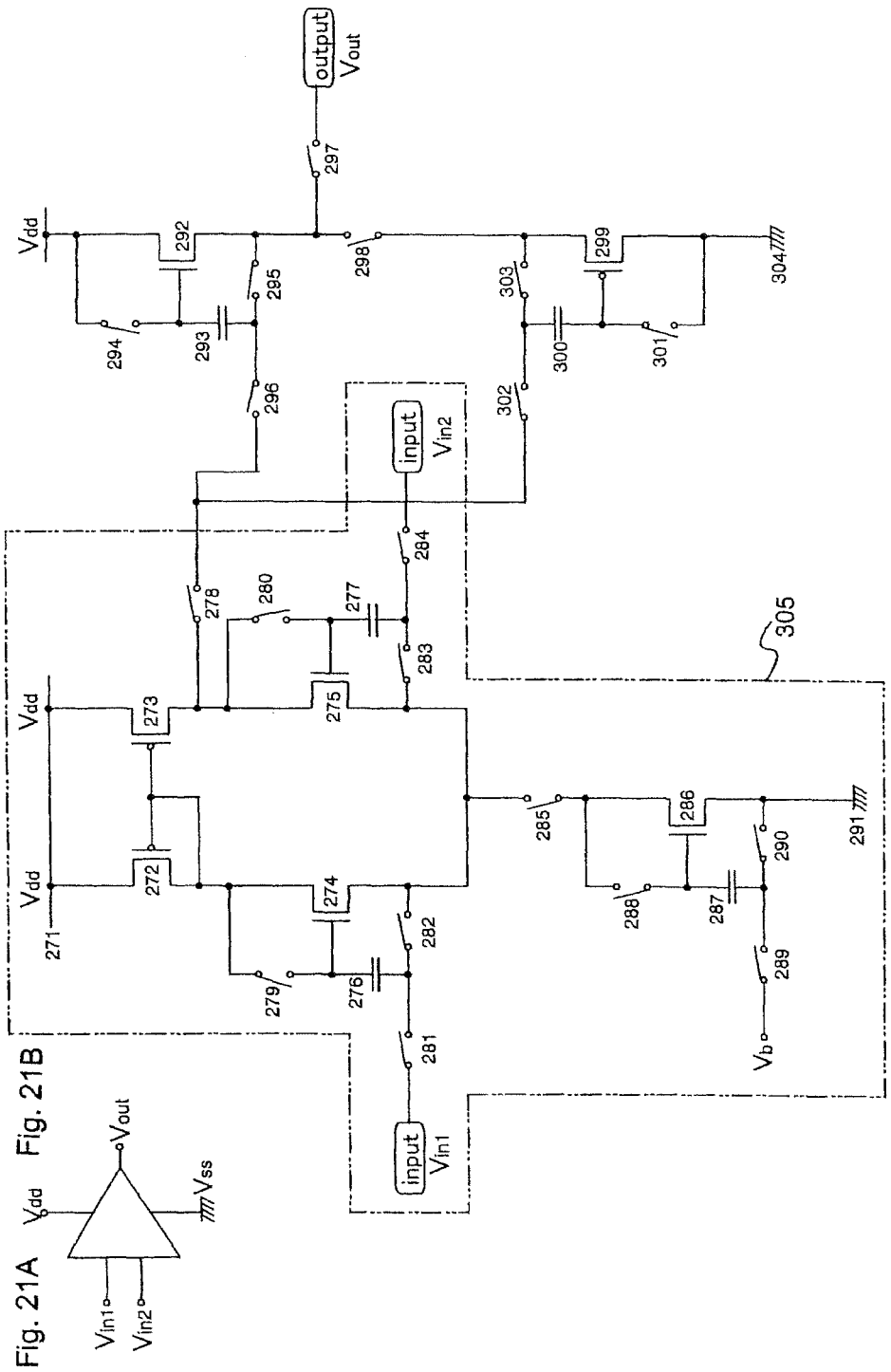

ELECTRIC CIRCUIT

CROSS-REFERENCE TO RELATED APPLICATIONS

This application is a continuation of U.S. application Ser. No. 14/475,611, filed Sep. 3, 2014, now allowed, which is a continuation of U.S. application Ser. No. 14/023,516, filed Sep. 11, 2013, now U.S. Pat. No. 8,841,941, which is a continuation of U.S. application Ser. No. 13/784,876, filed Mar. 5, 2013, now U.S. Pat. No. 8,536,937, which is a continuation of U.S. application Ser. No. 12/822,247, filed Jun. 24, 2010, now U.S. Pat. No. 8,400,191, which is a continuation of U.S. application Ser. No. 12/041,042, filed Mar. 3, 2008, now U.S. Pat. No. 7,746,157, which is a continuation of U.S. application Ser. No. 11/197,427, filed Aug. 5, 2005, now U.S. Pat. No. 7,348,825, which is a continuation of U.S. application Ser. No. 10/304,061, filed Nov. 26, 2002, now U.S. Pat. No. 6,927,618, which claims the benefit of a foreign priority application filed in Japan as Serial No. 2001-363484 on Nov. 28, 2001, all of which are incorporated by reference.

TECHNICAL FIELD

The present invention relates to the art of electric circuits. Specifically, it relates to the art of electric circuits having transistors.

BACKGROUND

The integrated circuit (IC), for broad use recently on a cellular phone or personal digital assistant, is formed with transistors or resistors as many as several hundreds of thousands to several millions on a silicon substrate in a size of nearly a 5-mm square. This plays an important role in device miniaturization and reliability improvement, and device mass production.

In designing an electric circuit for use on an integrated circuit (IC) or the like, it is frequent cases to design an amplifier circuit having a function to amplify a voltage or current of a signal small in amplitude. The amplifier circuit is broadly used because of a circuit requisite for eliminating strain occurrence to stably operate an electric circuit.

SUMMARY

The present invention has been made in view of the above problems. It is a problem to provide an electric circuit suppressing against the affection of transistor characteristic variation. More specifically, it is a problem, in an electric circuit having a function of current amplification, to provide an electric circuit capable of supplying a desired voltage while suppressing against the affection of threshold voltage variation of a transistor.

Means for Solving the Problems

In order to solve the above-mentioned problems, the present invention uses an electric circuit with a structure described below.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 1A and 1B are diagrams illustrating operations of a source follower circuit of the present invention.

FIGS. 2A and 2B are diagrams illustrating operations of a source follower circuit of the present invention.

FIGS. 5A-5C are diagrams illustrating operations of a source follower circuit.

FIGS. 6A and 6B are diagrams illustrating operations of a source follower circuit.

FIGS. 7A-7C are diagrams illustrating operations of a source follower circuit of the present invention.

FIGS. 10A and 10B are diagrams illustrating a structure of an operational amplifier of the present invention.

FIGS. 20A-20H are illustrations of electric appliances to which the present invention is applied.

FIGS. 21A and 21B are diagrams illustrating a structure of an operational amplifier of the present invention.

Like reference symbols in the various drawings indicate like elements.

DETAILED DESCRIPTION

Figure 3A:
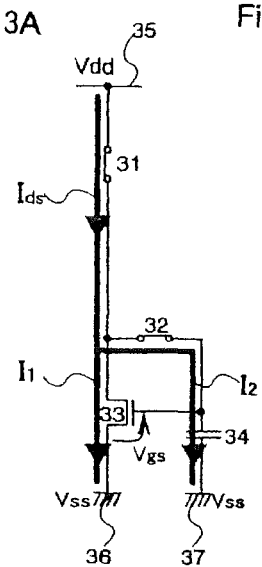
FIGS. 3A-3E are diagrams illustrating a structure and operations of an electric circuit of the present invention.

Herein, explained is the configuration and operation of a source follower circuit, as one example of amplifier circuit. At first, a configuration example of source follower circuit will be shown in FIG. 5A to explain an operation in a steady state. Next, an operating point of the source follower circuit will be explained, by using FIGS. 5B and 5C. Finally, an example of source follower circuit different in configuration from FIG. 5A will be shown in FIGS. 6A and 6B, to explain an operation in a transient state.

At first, a steady state operation is explained by using a source follower circuit in FIG. 5A.

In FIG. 5A, 11 is an n-channel amplifier transistor while 12 is an n-channel bias transistor. Note that, although the amplifier transistor 11 and bias transistor 12 in FIG. 5A is of an n-channel type, configuration may be by the use of p-channel transistors. Herein, the amplifier transistor 11 and the bias transistor 12 are assumably the same in characteristic and size, for simplification sake. It is further assumed that the current characteristic of them is ideal. Namely, it is supposed that, even if the amplifier transistor 11 or bias transistor 12 is changed in its source-to-drain voltage, there is no change in saturation-region current value.

Meanwhile, the amplifier transistor 11 has a drain region connected to a power line 13 and a source region connected to a drain region of the bias transistor 12. The bias transistor 12 has a source region connected to a power line 14.

The gate electrode of the bias transistor 12 is applied by a bias potential $V_b$. A power-source potential $V_{dd}$ is applied onto the power line 13 while a ground potential $V_{ss}$ (=0V) is applied onto the power line 14.

In the source follower circuit of FIG. 5A, the gate electrode of the amplifier transistor 11 is made as an input terminal so that an input voltage $V_{in}$ can be inputted to the gate electrode of the amplifier transistor 11. Also, the source region of the amplifier transistor 11 is made as an output terminal so that the potential on the source region of the amplifier transistor 11 provides an output potential $V_{out}$. The gate electrode of the bias transistor 12 is applied by a bias voltage $V_b$. When the bias transistor 12 operates in a saturation region, a current denoted by Ib assumably flows. At this time, because the amplifier transistor 11 and the bias transistor 12 are in a series connection, the same amount of current flows through the both transistors. Namely, when a current Ib flows through the bias transistor 12, a current Ib flows also through the amplifier transistor 11.

Herein, determined is an output potential $V_{out}$ in the source follower circuit. The output potential $V_{out}$ is lower in value than the input voltage $V_{in}$, by an amount of the voltage between the gate and the source $V_{gs1}$ of the amplifier transistor 11. At this time, the input voltage $V_{in}$, the output potential $V_{out}$ and the voltage between the gate and the source $V_{gs1}$ have a relationship satisfying the following Equation (1).

[Equation 1]

$$V_{out}=V_{in}-V_{gs1} \tag{1}$$

In the case the amplifier transistor 11 is operating in the saturation region, in order to flow a current Ib through the amplifier transistor 11 there is a necessity that the voltage between the gate and the source $V_{gs1}$ of the amplifier transistor 11 is equal to a bias potential $V_b$. If so, the following Equation (2) is held. However, Equation (2) is held only when the amplifier transistor 11 and the bias transistor 12 operate in the saturation region.

[Equation 2]

$$V_{out}=V_{in}-V_b \tag{2}$$

Next explained is an operating point of the source follower circuit by using FIGS. 5B and 5C showing a relationship of between a voltage and a current of the amplifier transistor 11 and bias transistor 12. More specifically, explanation is made on a case that the voltage between the gate and the source $V_{gs1}$ of the amplifier transistor 11 is same in value as the voltage between the gate and the source $V_{gs2}$ of the bias transistor 12, by using FIG. 5B. Next explained is a case that the voltage between the gate and the source $V_{gs1}$ of the amplifier transistor 11 is different in value from the voltage between the gate and the source $V_{gs2}$ of the bias transistor 12 wherein, for example, the bias transistor 12 is operating in a linear region, by using FIG. 5C.

In FIG. 5B, the dotted line 21 shows a relationship between a voltage and a current when the amplifier transistor 11 has a voltage between the gate and the source $V_{gs1}$ of $V_b$. The solid line 22 shows a relationship between a voltage and a current when the bias transistor 12 has a voltage between the gate and the source $V_{gs2}$ of $V_b$. Meanwhile, in FIG. 5C, the dotted line 21 shows a relationship between a voltage and a current when the amplifier transistor 11 has a voltage between the gate and the source $V_{gs1}$ of $V_b'$. The solid line 22 shows a relationship between a voltage and a current when the bias transistor 12 has a voltage between the gate and the source $V_{gs2}$ of $V_b$.

In FIG. 5B, the voltage between the gate and the source $V_{gs1}$ of the amplifier transistor 11 and the voltage between the gate and the source $V_{gs2}$ of the bias transistor 12 are in the same value, and further the bias potential $V_b$ and the voltage between the gate and the source $V_{gs2}$ of bias transistor 12 are in the same value. Consequently, the voltage between the gate and the source $V_{gs1}$ of the amplifier transistor 11 is in the same value as the bias potential $V_b$. Namely, this results in $V_{gs1}=V_{gs2}=V_b$. The amplifier transistor 11 and the bias transistor 12 are operating in the saturation region, as shown in FIG. 5B. At this time, the input voltage $V_{in}$ and the output potential $V_{out}$ have a relationship in a linear form.

On the other hand, in FIG. 5C, the voltage between the gate and the source $V_{gs1}$ of the amplifier transistor 11 is in a value different from the voltage between the gate and the source $V_{gs2}$ of bias transistor 12. Furthermore, the voltage between the gate and the source $V_{gs2}$ of bias transistor 12 is in a same value as the bias voltage $V_b$. Meanwhile, it is assumed that the voltage between the gate and the source $V_{gs1}$ of the amplifier transistor 11 is at the bias voltage $V_b'$. Namely, this results in $V_{gs2}=V_b$ and $V_{gs1}=V_b'$. As shown in FIG. 5C, the amplifier transistor 11 is operating in the saturation region while the bias transistor 22 is operating in the linear region. At this time, the input voltage $V_{in}$, the output potential $V_{out}$ and the bias potential $V_b'$ have a relationship satisfying the following Equation (3).

[Equation 3]

$$V_{out}=V_{in}-V_b' \tag{3}$$

Provided that the current flowing upon operating of the bias transistor 12 in the linear region is taken Ib', Ib'<Ib is given. Namely, by having $V_b'<V_b$, the both values of the input voltage $V_{in}$ and current Ib' decrease. Thereupon, the bias potential $V_b'$ also decreases. At this time, the input voltage $V_{in}$ and the output potential $V_{out}$ have a non-linear relationship.

Summarizing the above, in order to increase the amplitude of the output potential $V_{out}$ in the source follower circuit in a steady state, it is preferred to decrease the bias potential $V_b$. This is because of the following two reasons.

The first reason is that the output potential $V_{out}$ can be increased at a small bias potential $V_b$, as shown in Equation (2). The second reason is that, in the case of a great bias potential $V_b$ value, the bias transistor 12 readily operate in the linear region at a decreased input voltage $V_{in}$. In case the bias transistor 12 operates in the linear region, the input voltage $V_{in}$ and the output potential $V_{out}$ are ready to have a non-linear relationship.

Incidentally, because the bias transistor 12 is required in a conduction state, there is a need to provide a greater value of bias potential $V_b$ than a threshold voltage of the bias transistor 12.

So far explained was the operation in a steady state of the source follower circuit. Subsequently, explanation is made on the operation of the source follower circuit in a transient state, by using FIGS. 6A and 6B.

The source follower circuit shown in FIGS. 6A and 6B has a configuration designed by adding a capacitance device 15 to the circuit of FIG. 5A. The capacitance device 15 has one terminal connected to the source region of the amplifier transistor 11 and the other terminal connected to the power line 16. A ground potential $V_{ss}$ is applied onto the power line 16.

The capacitance device 15 has a same potential difference at between its both electrodes as the output potential $V_{out}$ of the source follower circuit. Herein, explained is the operation in a case of $V_{out}<V_{in}-V_b$, by using FIG. 6A. Next explained is the operation in a case of $V_{out}>V_{in}-V_b$, by using FIG. 6B.

At first, explanation is made on the operation in a transient state of the source follower circuit in the case of $V_{out}<V_{in}-V_b$, by using FIG. 6A.

In FIG. 6A, when t=0, the voltage between the gate and the source $V_{gs1}$ of the amplifier transistor 11 has a greater value than the voltage between the gate and the source $V_{gs2}$ of the bias transistor 12. Consequently, a great current flows through the amplifier transistor 11 to promptly hold charge on the capacitance device 15. Thereupon, the output potential $V_{out}$ increases to decrease the voltage between the gate and the source $V_{gs1}$ value of the amplifier transistor 11.

As time elapses (t=t1, t1>0), the amplifier transistor 11 goes into a steady state when its voltage between the gate and the source $V_{gs1}$ becomes equal to the bias potential $V_b$. At this time, the output potential $V_{out}$, the input voltage $V_{in}$ and the bias potential $V_b$ have a relationship satisfying the foregoing Equation (2).

Summarizing the above, in the case of $V_{out}<V_{in}-V_b$, the voltage between the gate and the source $V_{gs1}$ of the amplifier transistor 11 is greater in value than the bias potential $V_b$. Accordingly, a great current flows through the amplifier transistor 11, to promptly hold charge on the capacitance device 15. Hence, the time may be short that is required for the capacitance device 15 to hold predetermined charge, in other words the time required in writing a signal to the capacitance device 15.

Next, explanation is made on the operation in a transient state of the source follower circuit in the case of $V_{out}>V_{in}-V_b$, by using FIG. 6B.

In FIG. 6B, when t=0, the voltage between the gate and the source $V_{gs1}$ of the amplifier transistor 11 has a smaller value than the threshold voltage of the amplifier transistor 11. Consequently, the amplifier transistor 11 is in a non-conduction state. The charge stored on the capacitance device 15 flows in a direction toward the ground potential $V_{ss}$ through the bias transistor 12, finally being discharged. At this time, because the voltage between the gate and the source $V_{gs2}$ of the bias transistor 12 is in the same value as the bias potential $V_b$, the current flowing through the bias transistor 12 is Ib.

As time elapses (t=t1, t1>0), the output potential $V_{out}$ decreases while the voltage between the gate and the source $V_{gs1}$ of the amplifier transistor 11 increases. When the voltage between the gate and the source $V_{gs1}$ of the amplifier transistor 11 becomes equal to the bias potential $V_b$, a steady state is entered. At this time, the output potential $V_{out}$, the input voltage $V_{in}$ and the bias potential $V_b$ have a relationship satisfying the foregoing Equation (2). Note that, in the steady state, the output potential $V_{out}$ is kept at a constant value, and charge does not flow to the capacitance device 15. Thus, a current Ib flows through the amplifier transistor 11 and bias transistor 12.

Summarizing the above, in the case of $V_{out}>V_{in}-V_b$, the time for the capacitance device 15 to hold predetermined charge, in other words the write time of a signal to the capacitance device 15, relies upon the current Ib flowing through the bias transistor 12. The current Ib relies upon a magnitude of the bias potential $V_b$. Accordingly, in order to increase the current Ib and shorten the write time of a signal to the capacitance element 15, a necessity is raised to increase the bias potential $V_b$.

Incidentally, as a method of correcting for threshold-voltage variation of transistors, there is a method that variation is observed by an output of a circuit a signal has been inputted and thereafter the variation is inputted and fed back thereby carrying out a correction (e.g. see Non-Patent Document 1).

[Non-Patent Document] H. Sekine et al, "Amplifier Compensation Method for a Poly-Si TFT LCLV with an Integrated Data-Driver", IDRC '97, p. 45-48.

Problems to be Resolved by the Invention

The foregoing operation of the source follower circuit is to be carried out on an assumption the amplifier transistor 11 and the bias transistor 12 have the same characteristic. However, for the both transistors, variation occurs in the threshold voltage or mobility due to gathering of the factors, such as gate insulating film thickness or variation in channel-region crystal state caused due to the difference in fabrication process or substrate used.

For example, it is assumed, in FIG. 5A, that there is variation of 1 V provided that the amplifier transistor 11 has a threshold of 3 V and the bias transistor 12 has a threshold of 4 V. If so, in order to flow a current Ib, there is a need to apply a voltage for the voltage between the gate and the source $V_{gs1}$ of the amplifier transistor 11 lower by 1 V than the voltage between the gate and the source $V_{gs2}$ of the bias transistor 12. Namely, $V_{gs1}=V_b-1$ results. If so, $V_{out}=V_{in}-V_{gs1}=V_{in}-V_b+1$ results. Namely, in case variation occurs even by 1 V in the threshold voltage of the amplifier transistor 11 and bias transistor 12, variation is also caused in the output potential $V_{out}$.

An electric circuit shown in FIG. 3A includes switching elements 31 and 32 (hereinafter referred to as sw 31 and sw 32) having a switching function, an n-channel type transistor 33, and a capacitance device 34. A source region of the transistor 33 is connected to a power supply line 36 and a drain region thereof is connected to a power supply line 35 via the sw 31. A gate electrode of the transistor 33 is connected to one terminal of the capacitance device 34. In addition, the other terminal of the capacitance device 34 is connected to a power supply line 37. The capacitance device 34 carries out a function of holding a voltage between the gate and the source $V_{gs}$ of the transistor 33. In addition, a power supply voltage $V_{dd}$ is applied to the power supply line 35 and a ground voltage $V_{ss}$ is applied to the power supply lines 36 and 37.

Figure 3B:
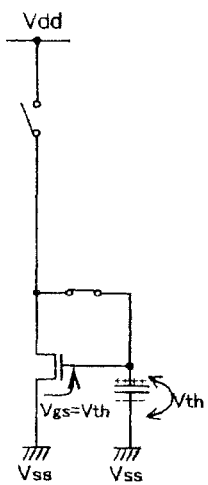
Figure 3C:
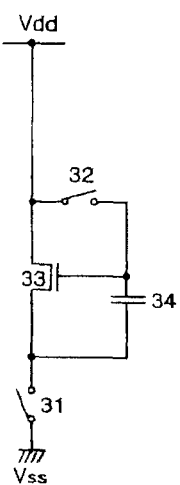

Although the transistor 33 is assumed to be an n-channel type in FIGS. 3A to 3C, the transistor 33 is not limited to this and it is possible to constitute it by a p-channel type transistor. In addition, an electric circuit having the same circuit element as FIG. 3A and a different connection structure is shown in FIG. 3C. Since operations of the electric circuit shown in FIG. 3C follow operations of the circuit shown in FIG. 3A discussed below, a description of the operations will be omitted here.

Further, in the electric circuit shown in FIG. 3A, an electric charge is held in the capacitance device 34 such that a potential difference between both the electrodes of the capacitance device 34 takes the same value as a threshold voltage of the transistor 33. This operation will be hereinafter described.

In FIG. 3A, the sw 31 and the sw 32 are ON. In this state, since the power supply voltage $V_{dd}$ is applied to the power line 35 and the ground voltage $V_{ss}$ is applied to the power supply lines 36 and 37, a potential difference is generated between the power supply line 35 and the power supply lines 36 and 37. As a result, an electric current $I_{ds}$ flows from the power supply line 35 toward directions of the transistor 33 and the capacitance device 34 via the sw 31 and the sw 32. At this point, the electric current $I_{ds}$ branches to $I_1$ and $I_2$ and flows. Note that the electric current $I_{ds}$ satisfies $I_{ds}=I_1+I_2$.

At an instance when an electric current starts flowing from the power supply line 35 in the directions of the power supply line 36 and the power supply line 37, an electric charge is not held in the capacitance device 34. Thus, the transistor 33 is OFF. Therefore, $I_1=0$ and $I_{ds}=I_2$.

Then, an electric charge is gradually stored in the capacitance device 34, and a potential difference starts to be generated between both the electrodes of the capacitance device 34. When the potential difference between both the electrodes has reached $V_{th}$, the transistor 33 is turned ON, and $I_1>0$. Since $Ids=I_1+I_2$ as described above, $I_2$ gradually decreases but an electric current is still flowing.

Then, in the capacitance device 34, the storage of electric charges is continued until the potential difference between both the electrodes of the capacitance device 34 reaches $V_{dd}$. When the storage of electric charges ends in the capacitance device 34 (FIGS. 3D and 3E, A point), the electric current $I_2$ stops flowing, and since the transistor 33 is ON, $I_{ds}=I_1$.

Figure 3D:
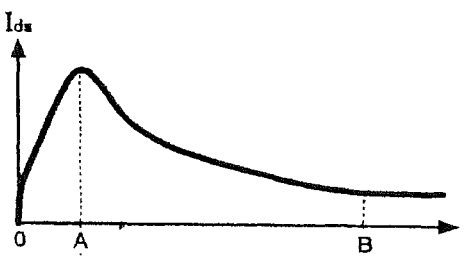
Figure 3E:
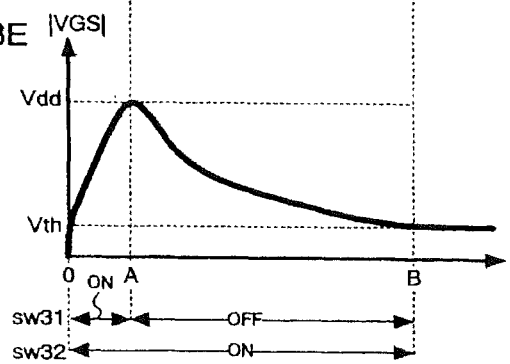

Subsequently, as shown in FIG. 3B, the sw 31 is turned OFF. The sw 32 continues to be ON. Then, the electric charges held in the capacitance device 34 flow in the direction of the transistor 33 via the sw 32. More specifically, the electric charges held in the capacitance device 34 flow from the drain region of the transistor 33 in the direction of the power supply line 36 via the source region and discharge. This operation is performed until the transistor 33 is turned OFF. That is, it is continued until the electric charges held in the capacitance device 34 reaches the same value as the threshold voltage of the transistor 33 (FIGS. 3D and 3E, B point).

In this way, electric charges are held such that a potential difference between both the electrodes of the capacitance device 34 takes the same value as the threshold voltage of the transistor 33.

As described above, the present invention provides an electric circuit which is arranged such that both electrodes of a capacitance device can hold a voltage between the gate and the source of a specific transistor. Further, the present invention provides an electric circuit which has a function capable of setting a potential difference between both electrodes of a capacitance device so as to be a threshold voltage of a specific transistor.

Moreover, in the present invention, a voltage between the gate and the source of a specific transistor held in a capacitance device is preserved as it is, and a signal voltage (voltage of a video signal, etc.) is inputted to a gate electrode of the transistor. Then, a voltage with the signal voltage added to the voltage between the gate and the source preserved in the capacitance device is inputted to the gate electrode of the transistor. As a result, a value found by adding a threshold voltage of the transistor and the signal voltage is inputted to the gate electrode of the transistor. That is, in the present invention, even if threshold voltages fluctuate among transistors, the value found by adding the threshold value of the transistor and the signal voltage is always inputted to a transistor to which a signal voltage is inputted. Thus, an electric circuit can be provided in which an influence of the variation of threshold values among transistors is suppressed.

Note that the mechanism in which a signal voltage is added to a voltage between the gate and the source held in a capacitance device can be explained according to the principle of electric charge preservation. The principle of electric charge preservation indicates the fact that a total quantity of electricity of an algebraic sum of a quantity of positive electricity and a quantity of negative electricity is definite. Here, the principle of electric charge preservation will be described using FIGS. 4A to 4C.

Figure 4A:
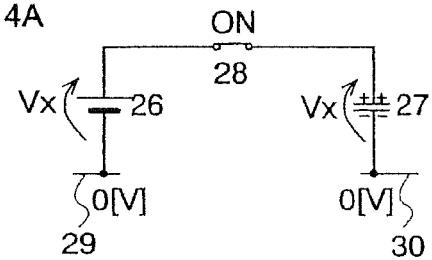
FIGS. 4A-4C are diagrams illustrating the principle of electric charge preservation.
Figure 4B:
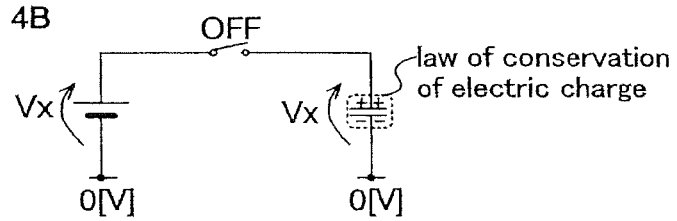
Figure 4C:
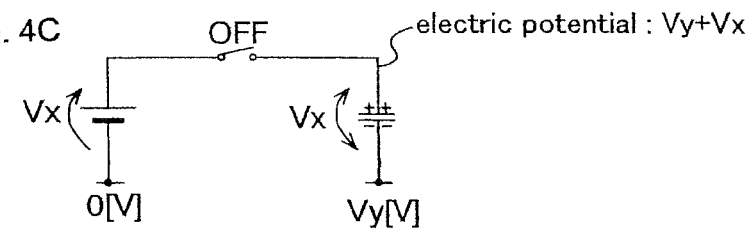

In FIGS. 4A to 4C, reference numeral 26 denotes a power supply (constant-voltage source) and 27 denotes a capacitance device. The power supply 26 and the capacitance device 27 are connected via an sw 28. The power supply 26 is connected to a power supply line 29 and the capacitance device 27 is connected to a power supply line 30.

In FIG. 4A, the sw 28 is ON, and 0 V is applied to the power supply line 29 and the power supply line 30. Further, a voltage $V_x$ is applied to the power supply 26, and the sw 28 is in a conduction state in this state. As a result, electric charges are held in the capacitance device 27 such that a potential difference between both electrodes of the capacitance device 27 becomes $V_x$.

Subsequently, in FIG. 4B, the sw 28 is turned OFF. At this point, the electric charges held in the capacitance device 27 continue to be held according to the principle of electric charge preservation.

Then, in FIG. 4C, a voltage $V_y$ is applied to the power supply line 30 connected to one terminal of the capacitance device 27. The sw 28 is OFF and 0 V is applied to the power supply line 29. At this point, the electric charges held in the capacitance device 27 are preserved, and a voltage $V_y$ to be applied to the power supply line 30 is added to the electric charges. That is, as shown in FIG. 4C, a voltage of one terminal of the capacitance device 27 becomes $(V_y+V_x)$.

In this way, in the capacitance device 27, when the held electric charges continue to be preserved as they are and a voltage of one terminal of the capacitance device 27 increases, a voltage of the other terminal increases accordingly.

Note that, in the present invention, a transistor using any material and a transistor undergone any means and manufacturing method may be used, and a transistor of any type may be used. For example, a thin film transistor (TFT) may be used. As the TFT, a TFT with any of an amorphous, polycrystal, and single crystal semiconductor layers may be used. As other transistors, a transistor produced on a single crystal substrate or a transistor produced on an SOI substrate may be used. In addition, a transistor formed of an organic matter or a carbon nanotube may be used. Moreover, an MOS transistor or a bipolar transistor may be used.

Mode For Carrying Out The Invention (Embodiment 1)

In this embodiment, a source follower circuit will be indicated as an example of the electric circuit of the present invention, and a structure and operations thereof will be described using FIGS. 1 and 2.

In FIGS. 1 and 2, reference numeral 211 denotes an n-channel type transistor for amplification and 212 denotes an n-channel type transistor for bias. Reference numerals 213 and 214 denote capacitance devices. In addition, reference numerals 215 to 222 denote elements having a switching function, and preferably, a semiconductor element such as a transistor or an analog switch is used. Reference numerals 223 and 224 denote power supply lines, and a power supply voltage $V_{dd}$ is applied to the power supply line 223 and a ground voltage $V_{ss}$ is applied to the power supply line 224.

Note that, in this embodiment, although a case in which the transistor for amplification 211 and the transistor for bias 212 are the n-channel type is shown, the present invention is not limited to this and both the transistors may be the p-channel type. In addition, polarities of both the transistors may be different.

In the case in which polarities of both the transistors are different, since a push-pull circuit is constituted, both the transistors function as the transistor for amplification. Thus, signals are inputted to both the transistors.

A drain region of the transistor for amplification 211 is connected to the power supply line 223 and a source region thereof is connected to the switches 217 to 219. A gate electrode of the transistor for amplification 211 is connected to one terminal of the capacitance device 213. The other terminal of the capacitance device 213 is connected to the source region of the transistor 211 via the switch 217. The capacitance device 213 carries out a function of holding a voltage between the gate and the source (threshold voltage) of the transistor for amplification 211. Note that the transistor for amplification 211 will hereinafter represented as the transistor 211.

A source region of the transistor for bias 212 is connected to the power supply line 224 and a drain region thereof is connected to the switches 219 and 220. A gate electrode of the transistor for bias 212 is connected to one terminal of the capacitance device 214. The other terminal of the capacitance device 214 is connected to the source region of the transistor for bias 212 via the switch 222. The capacitance device 214 carries out a function of holding a voltage between the gate and the source (threshold voltage) of the transistor for bias 212. Note that the transistor for bias 212 will be hereinafter represented as the transistor 212.

Conduction or non-conduction (ON or OFF) of the switches 215 to 222 is controlled according to a signal to be inputted. However, in FIGS. 1 and 2, illustration of a signal line or the like for inputting a signal to the switches 215 to 222 is omitted in order to simplify explanation.

In the source follower circuit shown in FIGS. 1 and 2, one terminal of the switch 216 becomes an input terminal. Via the input terminal, an input voltage $V_{in}$ (signal voltage) is inputted to the gate electrode of the transistor 211 via the switch 216 and the capacitance device 213. In addition, a bias voltage $V_b$ is inputted from one terminal of the switch 221. The bias voltage $V_b$ is inputted to a gate electrode of the transistor 212 via the switch 221 and the capacitance device 214. In addition, one terminal of the switch 218 is an output terminal, and a voltage of the source region of the transistor 211 becomes an output voltage $V_{out}$.

Note that, although the switch 218 is connected to the source region of the transistor 211 and connected to the drain region of the transistor 212 via the switch 219, the present invention is not limited to this. The switch 218 may be connected to the drain region of the transistor 212 and connected to the source region of the transistor 211 via the switch 219.

However, the switch 218 is preferably connected to the source region of the transistor 211 and connected to the drain region of the transistor 212 via the switch 219. This is because, in the case in which the switch 218 is connected to the drain region of the transistor 212 and connected to the source region of the transistor 211 via the switch 219, if there is an ON resistance in the switch 219, the output voltage $V_{out}$ is affected by it and decreases.

Next, operations of the source follower circuit shown in FIGS. 1 and 2 will be described.

In FIG. 1A, the switch 215, the switch 217, the switch 219, the switch 220, and the switch 222 are turned ON. Further, the other switches are turned OFF. In this state, since $V_{dd}$ is applied to the power supply line 223 and $V_{ss}$ is applied to the power supply line 224, a potential difference is generated between the power supply line 223 and the power supply line 224. As a result, an electric current flows toward the direction of the power supply line 224 from the power supply line 223.

At an instance when an electric current starts flowing in the direction of the power supply line 224 from the power supply line 223, electric charges are not held in the capacitance device 213 and the capacitance device 214. Therefore, the transistor 211 and the transistor 212 are OFF. The electric current flows in the direction of the power supply line 224 from the power supply line 223 via the switch 215 and the switch 217, subsequently via the switch 219, and further via the switch 220 and the switch 222.

Then, electric charges are gradually stored in the capacitance devices 213 and 214, and a potential difference starts to be generated between both the electrodes of the capacitance devices 213 and 214. When the potential difference between both the electrodes of the capacitance device 213 reaches a threshold voltage $V_{th1}$ of the transistor 211, the transistor 211 is turned ON. Similarly, when the potential difference between both the electrodes of the capacitance device 214 reaches a threshold voltage $V_{th2}$ of the transistor 212, the transistor 212 is turned ON.

In the capacitance devices 213 and 214, storage of electric charges is continued until the elements come into a stationary state.

Subsequently, as shown in FIG. 1B, when the storage of electric charges ends in the capacitance devices 213 and 214 and the elements comes into the stationary state, the switch 219 is turned OFF from ON, and the other switches maintain the state of FIG. 1A.

Then, positive electric charges held in the capacitance device 213 flow in the direction of the transistor 211 via the switch 215. More specifically, the positive electric charges held in the capacitance device 213 flow from the drain region of the transistor 211 via the switch 215 in the direction of the capacitance device 213 via the source region thereof and further via the switch 217. As a result, the potential difference between both the electrodes of the capacitance device 213 decreases. This operation is performed until the transistor 211 is turned OFF. That is, it is continued until the electric charges held in the capacitance device 213 become the same value as the threshold voltage $V_{th1}$ of the transistor 211.

In addition, positive electric charges held in the capacitance device 214 flow in the direction of the transistor 212 via the switch 220. More specifically, the positive electric charges held in the capacitance device 214 flow from the drain region of the transistor 212 via the switch 220 in the direction of the power supply line 224 via its source region. This operation is performed until the transistor 212 is turned OFF. That is, it is continued until the electric charges held in the capacitance device 214 become the same value as the threshold voltage $V_{th2}$ of the transistor 212.

In this way, the potential difference between both the electrodes of the capacitance device 213 takes the same value as the threshold voltage $V_{th1}$ of the transistor 211. In addition, the potential difference between both the electrodes of the capacitance device 214 takes the same value as the threshold voltage $V_{th2}$ of the transistor 212.

When the potential difference between both the electrodes of the capacitance device 213 takes the same value as the threshold voltage $V_{th1}$ of the transistor 211 and the potential difference between both the electrodes of the capacitance device 214 takes the same value as the threshold voltage $V_{th2}$ of the transistor 212 as described above, the switch 215, the switch 217, the switch 220, and the switch 222 are turned OFF (FIG. 2A). That is, at this point, all the switches 215 to 222 are OFF.

Note that it is desirable to turn off the switch 215, the switch 217, the switch 220, and the switch 222 after the potential difference of both the electrodes of the capacitance devices 213 and 214 take the same values as the threshold voltages $V_{th1}$ and $V_{th2}$ of the transistors 211 and 212. However, the present invention is not limited to this. In the case in which variation of the transistors 211 and 212 is small, since operations of the electric circuit does not specifically cause a problem, the switch 215, the switch 217, the switch 220, and the switch 222 may be turned OFF when the potential differences between both the electrodes of the capacitance devices 213 and 214 take values close to the threshold voltages $V_{th1}$ and $V_{th2}$ of the transistors 211 and 212, and timing therefore is not specifically limited.

Subsequently, the switch 216, the switch 218, the switch 219, and the switch 221 are turned ON (FIG. 2B). The other switches keep to be OFF. At this point, an input voltage $V_{in}$ is applied to the gate electrode of the transistor 211 from the input terminal via the switch 216 and the capacitance device 213. At this point, according to the principle of electric charge preservation, a value found by adding the input voltage $V_{in}$ to the threshold voltage $V_{th1}$ of the transistor 211 ($V_{th1}+V_{in}$) is applied to the gate electrode of the transistor 211. In addition, a value found by adding the input voltage $V_b$ to the threshold voltage $V_{th2}$ of the transistor 212 ($V_{th2}+V_b$) is applied to the gate electrode of the transistor 212.

Note that, when a transistor operates in a saturation region, expression (4) shown below is established. $I_{ds}$ is an amount of electric current flowing in a channel formation region of the transistor and $V_{gs}$ is a voltage between the gate and the source of the transistor. In addition, $V_{th}$ is a threshold voltage of the transistor.

[Numeral 4]

$$I_{ds} \propto (V_{gs}-V_{th})^2 \quad (4)$$

In the above expression (4), when it is assumed $V_k=V_{gs}-V_{th}$, expression (5) shown below is established.

[Numeral 5]

$$I_{ds} \propto V_k^2 \quad (5)$$

From expression (5), it is seen that $I_{ds}$ is proportional to a square of $V_k$ which is a value found by deducting a value of $V_{th}$ from $V_{gs}$.

Here, the above expressions (4) (5) are applied to the transistors 211 and 212 to find an output voltage $V_{out}$. Note that, in this embodiment, it is assumed that gate widths (W) and gate lengths (L) of the transistors 211 and 212 do not fluctuate but are identical. On the other hand, it is assumed that the threshold voltages $V_{th1}$, $V_{th2}$ of the transistors 211 and 212 fluctuate.

When a voltage applied to the gate electrode of the transistor 212 is assumed to be $V_{a2}$, $V_{a2}=V_b+V_{th2}$ is established. Moreover, when a value found by deducting the threshold voltage $V_{th2}$ from the voltage $V_{a2}$ applied to the gate electrode of the transistor 212 is assumed to be $V_{k2}$, expression (6) shown below is established.

[Numeral 6]

$$V_{k2}=V_{a2}-V_{th2}=(V_b+V_{th2})-V_{th2}=V_b \quad (6)$$

Then, when a voltage applied to the gate electrode of the transistor 211 is assumed to be $V_{a1}$, expression (7) shown below is established.

[Numeral 7]

$$V_{a1}=V_{in}+V_{th1} \quad (7)$$

Moreover, when a value found by deducting the threshold voltage $V_{th1}$ from the voltage between the gate and the source $V_{gs1}$ of the transistor 211 is assumed to be $V_{k1}$, expression (8) shown below is established.

[Numeral 8]

$$V_{k1}=V_{gs1}-V_{th1} \quad (8)$$

Here, since the same amount of electric current flows to the transistors 211 and 212, expression (9) shown below is established.

[Numeral 9]

$$V_{k1}=V_{k2}=V_b \quad (9)$$

Further, since the output voltage $V_{out}$ is a voltage of the source region of the transistor 211, expression (10) shown below is established.

[Numeral 10]

$$V_{out}=V_{a1}-V_{gs1}=(V_{in}+V_{th1})-(V_b+V_{th1})=V_{in}-V_b \quad (10)$$

As indicated in expression (10), the output voltage $V_{out}$ takes a value found by deducting the bias voltage $V_b$ from the input voltage $V_{in}$ and does not depend upon the threshold voltage. Thus, even if the threshold voltages of the transistor 211 and 212 fluctuate, an influence exerted on the output voltage $V_{out}$ can be suppressed.

Note that, although it is assumed in this embodiment that the gate widths (W) and the gate lengths (L) of the transistors 211 and 212 do not fluctuate but are identical, sizes of the gate widths (W) and the gate lengths (L) of both the transistors are not specifically limited.

In addition, in FIG. 7C, a source follower circuit in the case in which the transistor for bias 212 is not arranged is shown. Since operations of the source follower circuit shown in FIG. 7C are the same as the operations in FIGS. 1 and 2 described above except that the switch 219 is turned OFF at the time of the output operation, a description of the operations will be omitted in this embodiment.

Note that, in this specification, an operation for holding predetermined electric charges in a capacitance device is referred to as a setting operation. In this embodiment, the operations of FIGS. 1A and 1B and FIG. 2A correspond to the setting operation. In addition, an operation for inputting the input voltage $V_{in}$ and the bias voltage $V_b$ and taking out the output Voltage $V_{out}$ is referred to as an output operation. In this embodiment, the operation of FIG. 2B corresponds to the output operation.

As described above, in the present invention, even if threshold voltages fluctuate among transistors, in a transistor to which a signal voltage such as the input voltage $V_{in}$ or the bias voltage $V_b$ is inputted, a value found by adding a threshold value of the transistor and the signal voltage is always inputted. Thus, an electric circuit in which an influence of variation of threshold voltages among transistors is suppressed can be provided.

(Embodiment 2)

In the source follower circuit shown in FIGS. 1 and 2, the case in which it includes the n-channel type transistor for amplification 211 and the n-channel type transistor for bias 212 is shown. Next, in this embodiment, a source follower circuit including a p-channel type transistor for amplification 211 and a p-channel type transistor for bias 212 is shown in FIGS. 7A to 7C, and its structure will be described. Note that, since operations of the source follower circuit shown in FIGS. 7A to 7C follow the operations of the embodiment 1, a description of the operations will be omitted here.

In FIGS. 7A to 7C, reference numeral 231 denotes a p-channel type transistor for bias and 232 denotes a p-channel type transistor for amplification. Reference numerals 233 and 234 denote capacitance devices. In addition, reference numerals 235 to 242 denote elements having a switching function, and preferably, a semiconductor element such as a transistor or an analog switch is used. Reference numerals 243 and 244 denote power supply lines, and a power supply voltage $V_{dd}$ is applied to the power supply line 243 and a ground voltage $V_{ss}$ is applied to the power supply line 244.

Note that, although the case in which the transistor for amplification 232 and the transistor for bias 231 are the p-channel type is indicated in this embodiment, polarities of both the transistors may be different as in a push-pull circuit.

A source region of the transistor for bias 231 is connected to the power supply line 243 and a drain region thereof is connected to the switches 235 and 239. A gate electrode of the transistor for bias 231 is connected to one terminal of the capacitance device 233. The other terminal of the capacitance device 233 is connected to the power supply line 243 via the switch 237. The capacitance device 233 carries out a function of holding a voltage between the gate and the source (threshold voltage) of the transistor for bias 231.

A drain region of the transistor for amplification 232 is connected to the power supply line 244 and a source region thereof is connected to the switches, 238, 239, and 242. A gate electrode of the transistor for amplification 232 is connected to one terminal of the capacitance device 234. The other terminal of the capacitance device 234 is connected to the source region of the transistor for amplification 232 via the switch 242. The capacitance device 234 carries out a function of holding a voltage between the gate and the source (threshold voltage) of the transistor for amplification 232.

Conduction or non-conduction (ON or OFF) of the switches 235 to 242 is controlled according to a signal to be inputted. However, in FIGS. 7A to 7C, illustration of a signal line or the like for inputting a signal to the switches 235 to 242 will be omitted in order to simplify explanation.

Note that, although the switch 238 is connected to the source region of the transistor for amplification 232 and connected to the drain region of the transistor for bias 231 via the switch 239, the present invention is not limited to this. The switch 238 may be connected to the drain region of the transistor for bias 231 and connected to the source region of the transistor for amplification 232 via the switch 239.

However, the switch 238 is preferably connected to the source region of the transistor for amplification 232 and connected to the drain region of the transistor for bias 231 via the switch 239. This is because, in the case in which the switch 238 is connected to the drain region of the transistor for bias 231 and connected to the source region of the transistor for amplification 232 via the switch 239, if there is an ON resistance in the switch 239, the output voltage $V_{out}$ is affected thereby and decreases.

In the source follower circuit shown in FIGS. 7A to 7C, one terminal of the switch 241 becomes an input terminal. An input voltage $V_{in}$ (signal voltage) inputted form the input terminal is inputted to the gate electrode of the transistor for amplification 232 via the switch 241 and the capacitance device 234. In addition, a bias voltage $V_b$ is inputted from one terminal of the switch 236. The bias voltage $V_b$ is inputted to the gate electrode of the transistor 231 via the switch 236 and the capacitance device 233. Further, one terminal of the switch 238 is an output terminal, and a voltage of the source region of the transistor for amplification 232 becomes the output voltage $V_{out}$.

Note that sizes of the gate widths (W) and the gate lengths (L) of the transistor for bias 231 and the transistor for amplification 232 are not specifically limited.

In addition, in FIG. 7B, a source follower circuit in the case in which the transistor for bias 231 is not arranged is shown. Since operations of the source follower circuit shown in FIG. 7B follow the operations of FIGS. 1 and 2 described above except that the switch is turned OFF at the time of the output operation, a description of the operations will be omitted in this embodiment.

It is possible to arbitrarily combine this embodiment with the embodiment 1.

(Embodiment 3)

In the above-mentions embodiments 1 and 2, the source follower circuit to which the present invention is applied is described. However, the present invention can be applied to various circuits such as an arithmetic and logic unit represented by a differential amplifier circuit, a sense amplifier, an operational amplifier, and the like. In this embodiment, an arithmetic and logic unit to which the present invention is applied will be described using FIGS. 8 to 10.

First, a differential amplifier circuit to which the present invention is applied will be described using FIG. 8. In the differential amplifier circuit, arithmetic operation of a difference between an input voltage $V_{in1}$ and an input voltage is performed to output an output voltage $V_{out}$.

Figure 8:
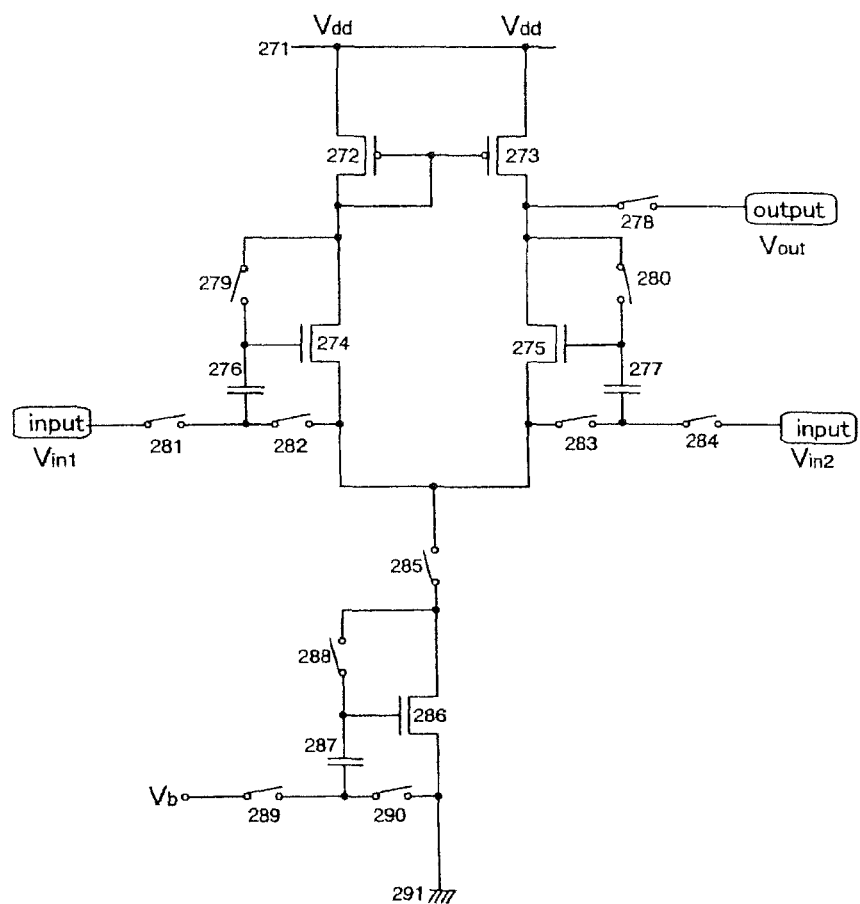
FIG. 8 is a diagram illustrating a structure of a differential amplifier circuit of the present invention.

In the differential amplifier shown in FIG. 8, reference numerals 272 and 273 denote p-channel type transistors and 274, 275, and 286 denote n-channel type transistors. Reference numerals 276, 277, and 287 denote capacitance devices. In addition, switches 278 to 285, a switch 351, switches 288 to 290 are elements having a switching function, and preferably, a semiconductor element such as a transistor is used. Further, a power supply voltage $V_{dd}$ is applied to a power supply line 271 and a ground voltage $V_{ss}$ is applied to a power supply line 291.

In the differential amplifier circuit shown in FIG. 8, a gate electrode of the transistor 274 is an input terminal, and the input voltage $V_{in1}$ is inputted to the gate electrode of the transistor 274. In addition, a gate electrode of the transistor 275 is also an input terminal, and the input voltage $V_{in2}$ is inputted to the gate electrode of the transistor 275. Further, a drain region of the transistor 275 is an output terminal, and a voltage of the drain region of the transistor 275 becomes the output voltage $V_{out}$.

A drain region of the transistor 272 is connected to the power supply line 271 and a source region thereof is connected to a drain region of the transistor 274. A drain region of the transistor 273 is connected to the power supply line 271 and a source region thereof is connected to the drain region of the transistor 275. A gate electrode of the transistor 272 and a gate electrode of the transistor 273 are connected. Note that resistors may be arranged instead of the transistors 272 and 273.

The drain region of the transistor 274 is connected to the power supply line 271 via the transistor 272 and a source region thereof is connected to one terminal of the capacitance device 276 via the switch 282. The gate electrode of the transistor 274 is connected to the other terminal of the capacitance device 276. The capacitance device 276 carries out a function of holding a voltage between the gate and the source (threshold voltage) of the transistor 274.

The drain region of the transistor 275 is connected to the power supply line 271 via the transistor 273 and a source region thereof is connected to one terminal of the capacitance device 277 via the switch 283. The gate electrode of the transistor 275 is connected to the other terminal of the capacitance device 277. The capacitance device 277 carries out a function of holding a voltage between the gate and the source (threshold voltage) of the transistor 275.

A drain region of the transistor 286 is connected to the source region of the transistor 274 and the source region of the transistor 275 via the switch 285 and the switch 351, and a source region of the transistor 286 is connected to one terminal of the capacitance device 287 via the switch 290. A gate electrode of the transistor 286 is connected to the other terminal of the capacitance device 287. The capacitance device 287 carries out a function of holding a voltage between the gate and the source (threshold voltage) of the transistor 286.

Further, since descriptions of an operation for holding predetermined electric charges in the capacitance device 276, an operation for holding predetermined electric charges in the capacitance device 277, and an operation for holding predetermined electric charges in the capacitance device 287 follow the embodiment 1, the operations will be described briefly.

Figure 18:
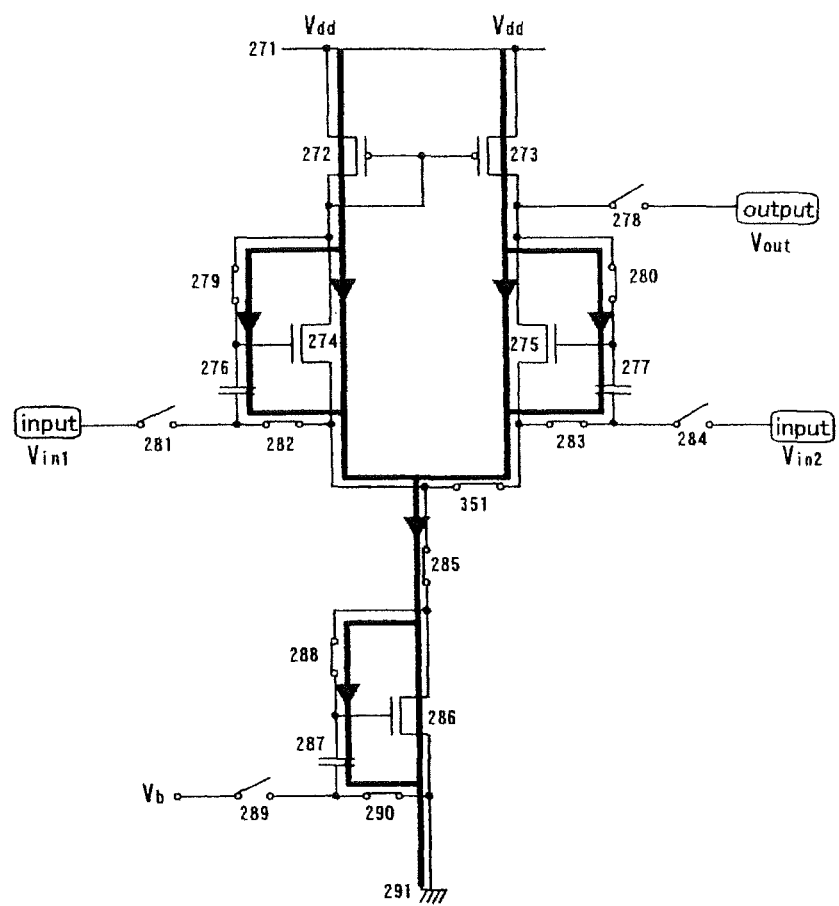
FIG. 18 is a diagram showing the operational amplifier of the present invention.
Figure 19:
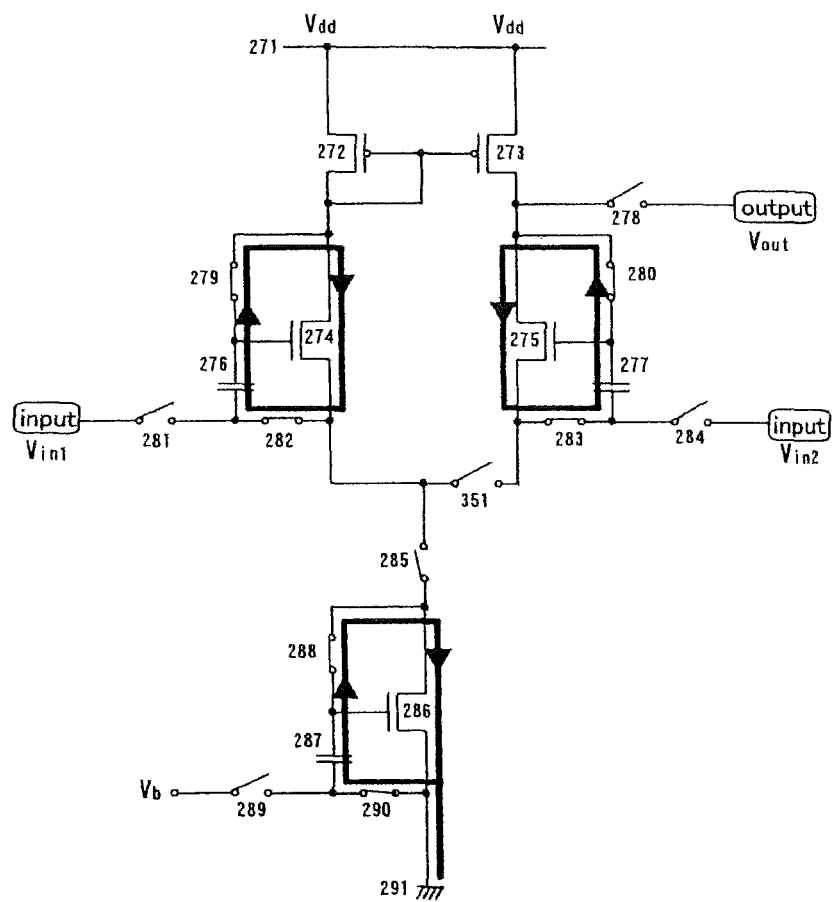
FIG. 19 is a diagram showing the operational amplifier of the present invention.

First, as shown in FIG. 18, initialization is performed. In order to perform the initialization, it is sufficient to bring the transistors 274, 275, and 286 into a state in which the transistors are turned ON. Then, as shown in FIG. 19, the transistors 274, 275, and 286 are operated such that voltage between the gate and the sources of the transistors converge on a threshold voltage.

Figure 22:
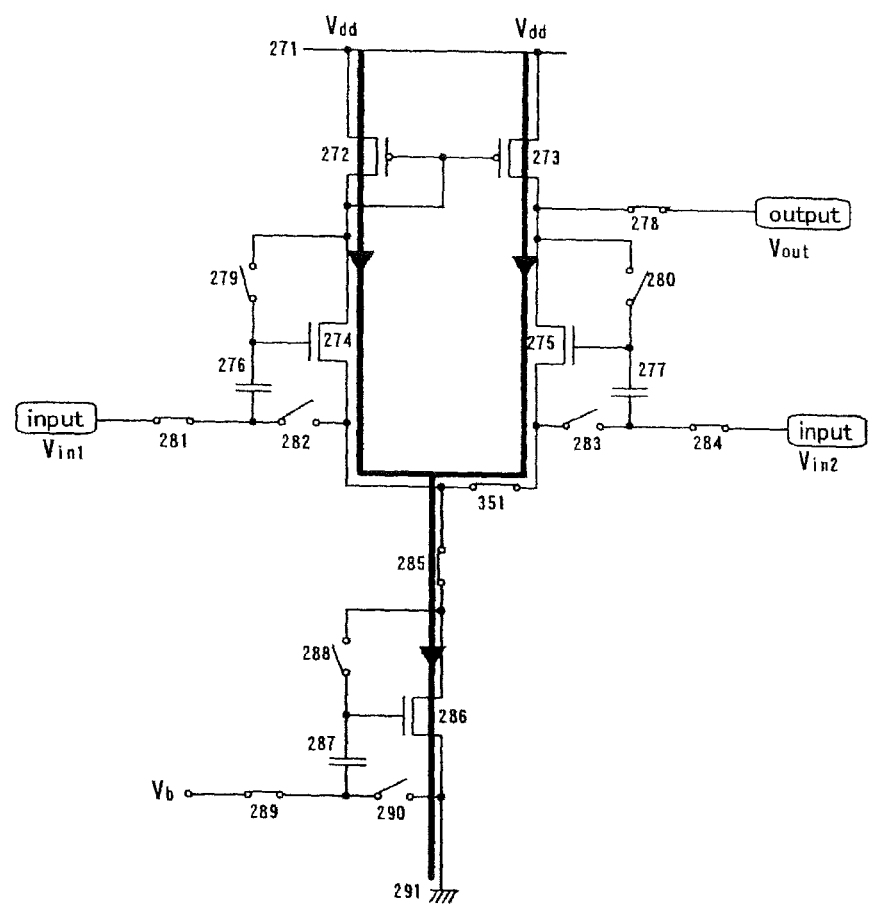
FIG. 22 is a diagram showing an operational amplifier of the present invention.

Then, when holding of the predetermined electric charges in the capacitance device 276 ends, as shown in FIG. 22, an input voltage $V_{in1}$ is inputted to the gate electrode of the transistor 274, and when holding of the predetermined electric charges in the capacitance device 277 ends, an input voltage $V_{in2}$ is inputted to the gate electrode of the transistor 275. In addition, when holding of the predetermined electric charges in the capacitance device 287 ends, a bias voltage $V_b$ is inputted to the gate electrode of the transistor 286, and an output operation is performed. Since a description of the operation at this point follow the embodiment 1, the description will be omitted in this embodiment.

Figure 17:
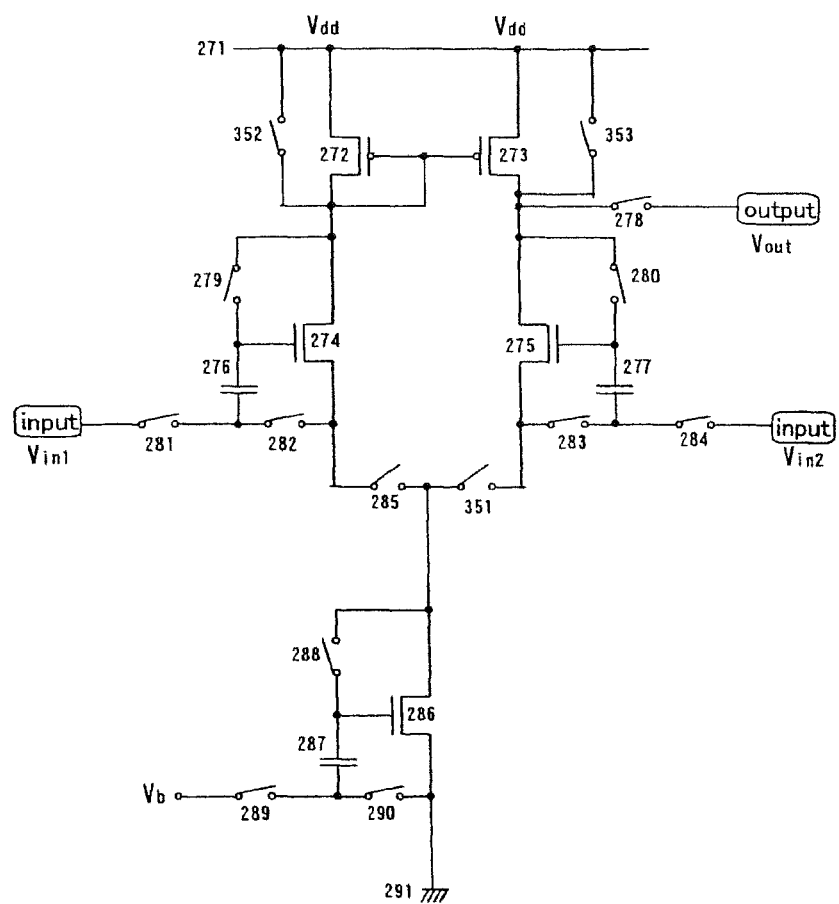
FIG. 17 is a diagram showing an operational amplifier of the present invention.

Note that the circuit of FIG. 8 may be improved to be a circuit shown in FIG. 17. In FIG. 17, switches 352 and 353 are additionally arranged in parallel with the transistors 272 and 273. The switches 352 and 353 are turned ON when the setting operation is performed (at the time when a threshold voltage is being obtained) and are turned OFF at the time when the output operation is performed (at the time when the circuit is operated as an ordinary differential circuit). By the addition of the switches, an electric current can be easily supplied to the transistors 274 and 275 at the time when the setting operation is performed, or voltages of the drains of the transistors 274 and 275 can be easily fixed.

In addition, in the circuits of FIGS. 8 and 17, positions of the switches 285 and 351 are different. However, since it is sufficient to bring the transistors 274, 275, and 286 into a state in which the transistors are not electrically connected at the time of an operation for obtaining a threshold voltage, if this condition is satisfied, the switches 285 and 351 may be arranged anywhere.

Subsequently, the case in which the transistors constituting the differential amplifier circuit shown in FIG. 8 has an opposite conduction type will be described using FIGS. 9 and 23.

Figure 9:
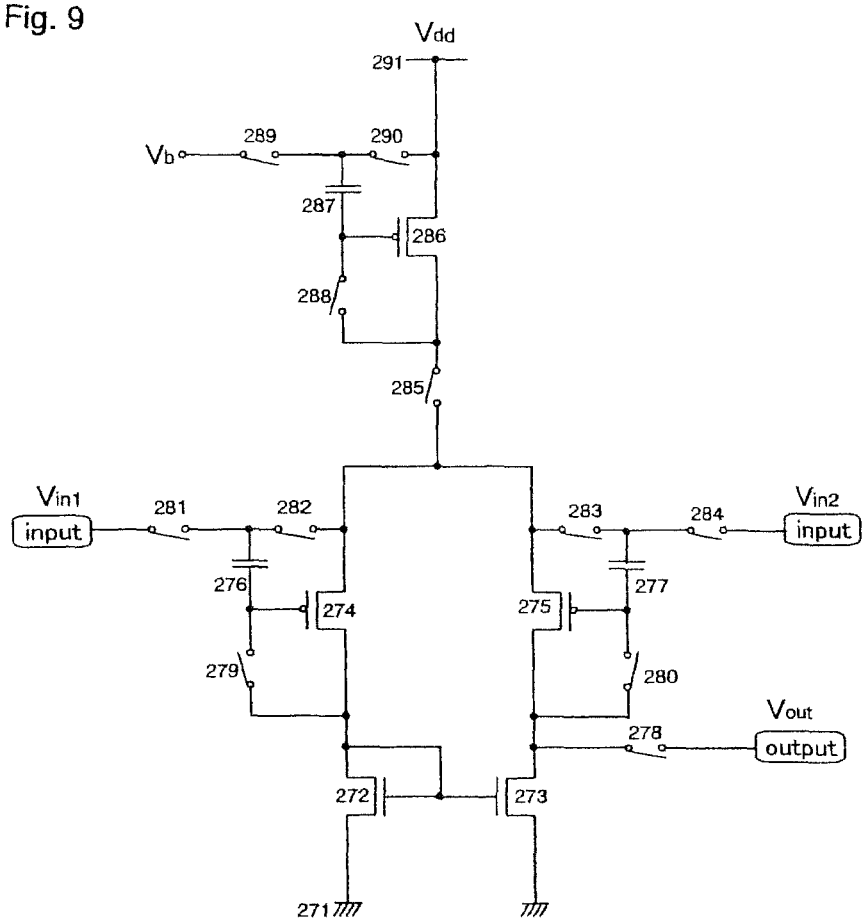
FIG. 9 is a diagram illustrating a structure of a differential amplifier circuit of the present invention.
Figure 23:
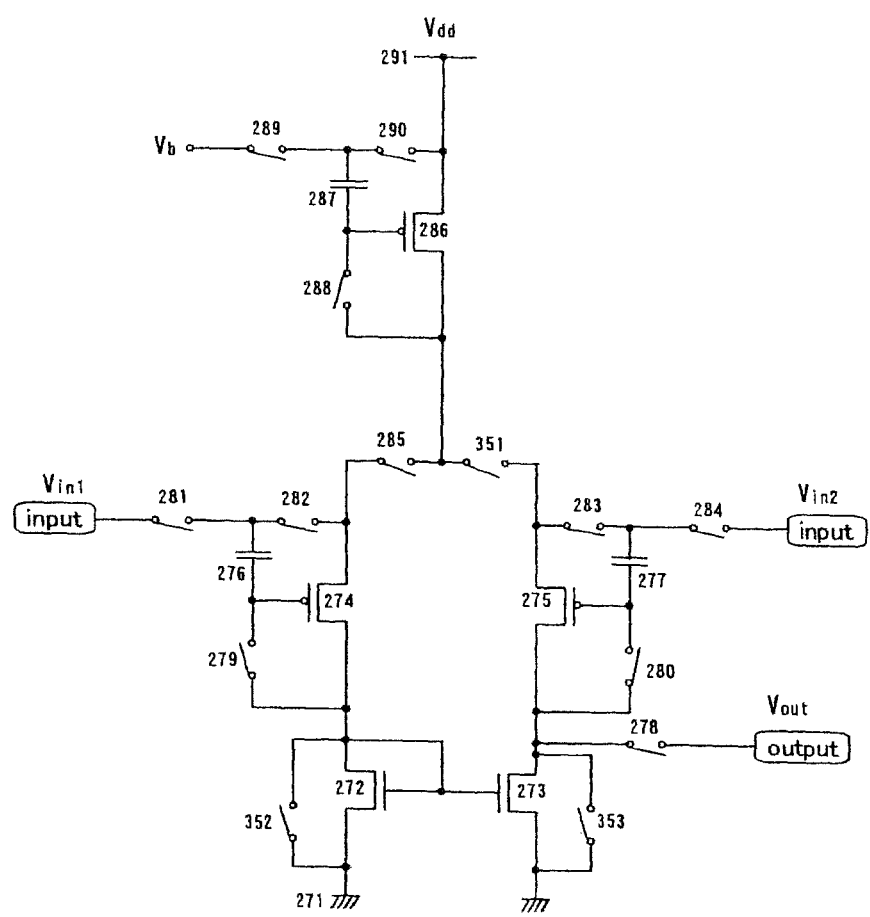
FIG. 23 is a diagram showing an operational amplifier of the present invention.

In differential amplifier circuits shown in FIGS. 9 and 23, reference numeral 272 and 273 denotes n-channel type transistors and 274, 275, and 286 are p-channel type transistors. The gate electrode of the transistor 274 is an input terminal, and the input voltage $V_{in1}$ is inputted to the gate electrode of the transistor 274. In addition, the gate electrode of the transistor 275 is also an input terminal, and the input voltage $V_{in2}$ is inputted to the gate electrode of the transistor 275. Further, a voltage of the source region of the transistor 275 becomes the output voltage $V_{out}$. Moreover, the bias voltage $V_b$ is inputted to the gate electrode of the transistor 286.

Note that, in the differential amplifier circuits shown in FIGS. 9 and 23, structures and operations are the same as those of the differential amplifier circuits shown in FIGS. 8 and 17 except that the power supply voltage $V_{dd}$ is applied to the power supply line 291 and the ground voltage $V_{ss}$ is applied to the power supply line 271, a description thereof will be omitted here.

In addition, although the electric circuits shown in FIGS. 8 and 9 are shown as differential amplifier circuits in this embodiment, the present invention is not limited to this, and the electric circuits can be also used as other arithmetic and logic units such as a sense amplifier by appropriately changing voltages inputted as the input voltage $V_{in1}$ and the input voltage $V_{in2}$.

Next, an operational amplifier to which the present invention is applied will be described using FIGS. 10A and 10B. FIG. 10A shows circuit symbols of the operational amplifier and FIG. 10B shows a circuit structure of the operational amplifier.

Note that there are various structures as the circuit structure of the operational amplifier. Therefore, in FIGS. 10A and 10B, the case in which a source follower circuit is combined with a differential amplifier circuit is described as the simplest case. Thus, the circuit structure is not limited to FIGS. 10A and 10B.

In the operational amplifier shown in FIG. 10A, characteristics are defined by a relationship between the input voltages $V_{in1}$ and $V_{in2}$ and the output voltage $V_{out}$. More specifically, the operational amplifier has a function of outputting the output voltage $V_{out}$ by multiplying a voltage of a difference between the input voltage $V_{in1}$ and the input voltage $V_{in2}$ by a degree of amplification A.

In the operational amplifier shown in FIG. 10B, the gate electrode of the transistor 274 is an input terminal, and the input voltage $V_{in1}$ is inputted to the gate electrode of the transistor 274. In addition, the gate electrode of the transistor 275 is also an input terminal, and the input voltage $V_{in2}$ is inputted to the gate electrode of the transistor 275. In addition, a voltage of the source region of the transistor 292 becomes the output voltage $V_{out}$. Further, a bias voltage is inputted to the gate electrode of the transistor 286.

In the circuit shown in FIG. 10B, a portion enclosed by a dotted line denoted by reference numeral 305 has the same structure as the differential amplifier circuit shown in FIG. 8. Further, since a portion enclosed by a dotted line denoted by reference numeral 306 is the same as the source follower circuit shown in FIGS. 1 and 2, a description of a detailed structure of the operational amplifier shown in FIG. 10B will be omitted.

In addition, an operational amplifier in the case in which a transistor 299 is the p-channel type is shown in FIGS. 21A and 21B. In FIG. 21B, one terminal of a capacitance device 300 is connected to the drain region of the transistor 275 via the switches 302 and 278.

Note that it is possible to arbitrarily combine this embodiment with the embodiments 1 and 2.

(Embodiment 4)

Figure 11A:
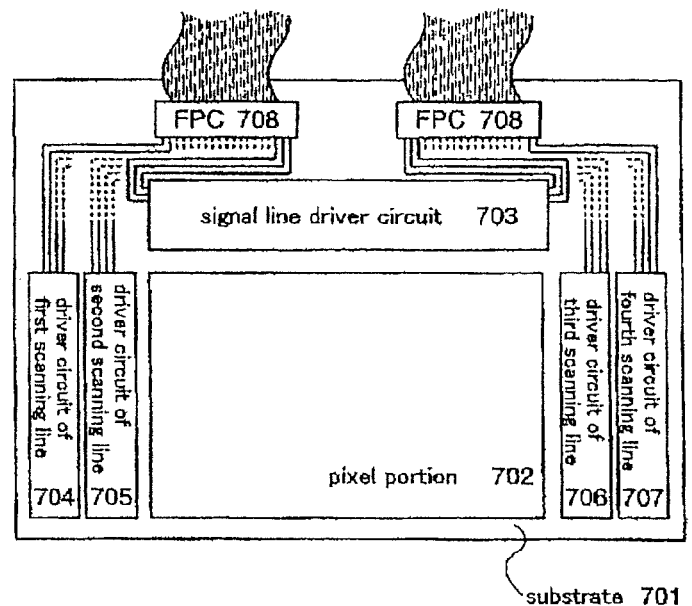
FIGS. 11A-11C are diagrams showing a semiconductor device of the present invention.
Figure 11B:
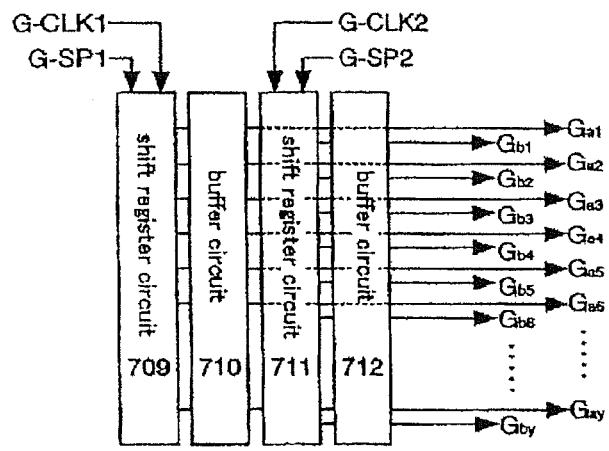
Figure 11C:
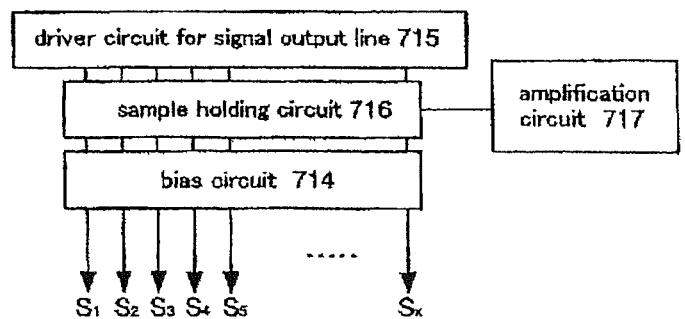
Figure 12:
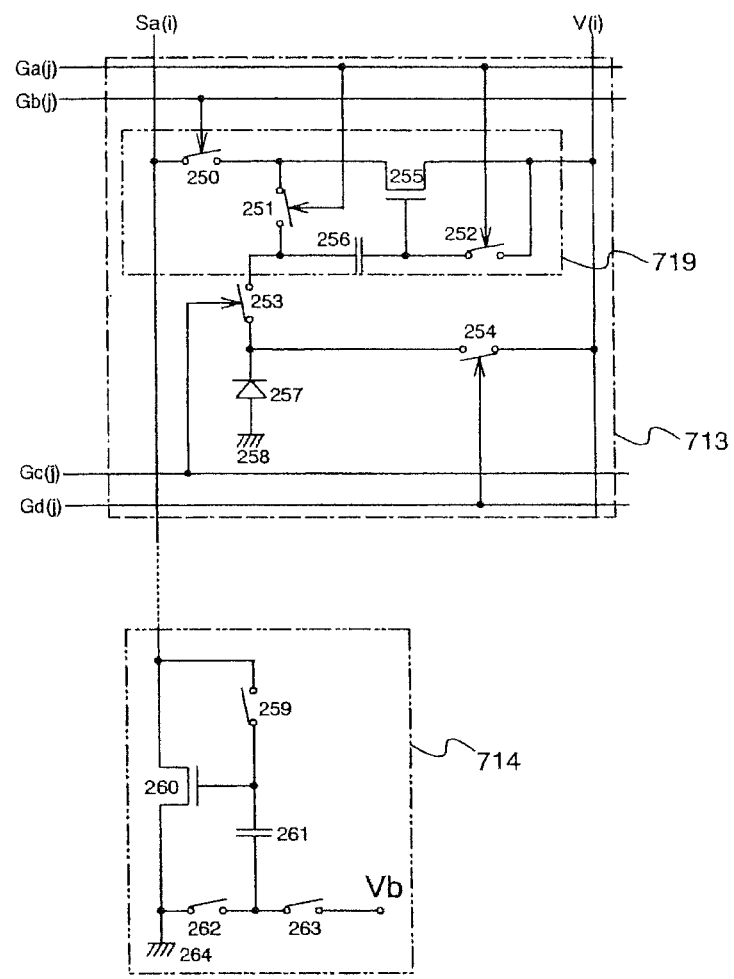
FIG. 12 is a diagram showing pixels and a circuit for bias of the semiconductor device of the present invention.

This embodiment explains a pixel and a driving circuit (a bias circuit) of the configuration and operation in a semiconductor device having a photoelectric device to which the invention is applied, by using FIGS. 11 and 12.

The semiconductor device shown in FIG. 11A has a pixel region 702 having a plurality of pixels arranged in a matrix form on a substrate 701. Around the pixel region 702, there are provided a signal-line drive circuit 703 and first to fourth scanning line drive circuits 704 to 707. Although the semiconductor device of FIG. 11A has the signal line drive circuit 703 and the first to fourth scanning line drive circuits 704 to 707, the invention is not limited to this, i.e. the signal line drive circuit and scanning line drive circuits are arbitrarily arranged in the number depending upon a pixel configuration. Also, signals are externally supplied to the signal line drive circuit 703 and first to fourth scanning line drive circuits 704 to 707 through an FPC 708. However, the invention is not limited to this but the electric circuits other than the pixel region may be use an IC to externally supply signals.

First explained is a configuration of the first scanning line drive circuit 704 and second scanning line drive circuit 705, by using FIG. 11B. The third scanning line drive circuit 706 and the fourth scanning line drive circuit 707 conform to the diagram of FIG. 11B, and hence graphic display is omitted.

The first scanning line drive circuit 704 has a shift register 709 and a buffer 710. The second scanning line drive circuit 705 has a shift register 711 and a buffer 712. Briefly explain the operation, the shift register 709, 711 sequentially outputs sampling pulses according to a clock signal (G-CLK), start pulse (S-SP) and clock inversion signal (G-CLKb). Thereafter, the pulse amplified by the buffer 710, 712 is inputted to scanning lines and made in a selective state row by row.

Note that configuration may be made such that a level shifter is arranged between the shift register (709, 711) and the buffer (710, 712). The arrangement of a level shifter circuit can increase voltage amplitude.

Next explained is the configuration of the signal line drive circuit 703, by using FIG. 11C.

The signal line drive circuit 703 has a signal output line drive circuit 715, a sample hold circuit 716, a bias circuit 714 and an amplifier circuit 717. If functions of each circuits are easily explained, the bias circuit 714, in a pair with an amplifier transistor of each pixel, forms a source follower circuit. The sample hold circuit 716 has a function to temporarily store a signal, make an analog-digital conversion and reduce noise. The signal output line drive circuit 715 has a signal output function to sequentially output temporarily stored signals. The amplifier circuit 717 has a circuit to amplify a signal outputted from the sample hold circuit 716 and signal output line drive circuit 715. Incidentally, the amplifier circuit 717 may not be arranged where no signal amplification is required.

Explanation is made on the configuration and operation of a circuit of a pixel 713 arranged at i-th column and j-th row in the pixel region 702 and a bias circuit 714 at around the i-th column, by using FIG. 12.

First explained is the configuration of the circuit of the pixel 713 arranged at i-th column and j-th row and the bias circuit 714 at around the i-th column.

The pixel of FIG. 12 has first to fourth scanning lines Ga(j) to Gd(j), a signal line S(i) and a power line V(i), and also an n-channel transistor 255, a photoelectric converter device 257 and switches 250 to 254.

Although the transistor 255 is the n-channel type in this embodiment, the invention is not limited to this, i.e. it may be a p-channel type. However, because the transistor 255 and the transistor 260 form a source follower circuit, the both transistors are preferably in the same polarity.

The switches 250 to 254 are semiconductor devices having switching functions, which preferably use transistors. The switches 251 and 252 are on-off controlled according to a signal inputted through the first scanning line Ga(j). The switch 250 is on-off controlled according to a signal inputted through the second scanning line Gb(j). The switch 253 is on-off controlled according to a signal inputted through the third scanning line Gc(j). The switch 254 is on-off controlled according to a signal inputted through the fourth scanning line Gd(j).

The transistor 255 has source and drain regions one of which is connected to a power line V(i) and the other is connected to a signal line S(i) through the switch 250. The transistor 255 has a gate electrode connected to one terminal of a capacitance device 256. The other terminal of the capacitance device 256 is connected to one terminal of a photoelectric converter device 257 through the switch 253. The other terminal of the photoelectric converter device 257 is connected to a power line 258. The power line 258 is applied with a ground potential $V_{ss}$. The capacitance device 256 has a role to hold a voltage between the gate and the source (a threshold voltage) of the transistor 255.

The bias circuit 714 has a transistor 260, a capacitance device 261 and switches 259, 262 and 263. The transistor 260 has a source region connected to a power line 264 and a drain region connected to the signal line S(i). The power line 264 is applied with a ground potential $V_{ss}$. The transistor 260 has a gate electrode connected to one terminal of the capacitance device 261. The other terminal of the capacitance device 261 is connected to the power line 264 via a switch 262. The capacitance device 261 has a role to hold a voltage between the gate and the source (a threshold voltage) of the transistor 260.

In FIG. 12, the region surrounded by the dotted line shown at 719 and region surrounded by the dotted line shown at 714 corresponds to a source follower circuit.

Next explained briefly is the operation of the circuit of the pixel 713 arranged at i-th column and j-th row and the bias circuit 714 at around the i-th column.

At first, the switches 250 to 252 of the pixel 713 and the switches 259 and 262 of the bias circuit 714 are turned into an on-state. The other switches than those are turned off. Thereupon, a potential difference is caused between the power source line V(i) and the power source line 264. As a result, a current flows toward the power source line 264 from the power source line V(i) via switches 252 and 251, then, via switches 250 and 259, and then, via the switch 262.

In the instant a current begins to flow, no charge is held on the capacitance devices 256, 261. Consequently, the transistors 255, 260 are off.

Then, charge is gradually built up on the capacitance devices 256 and 261 to cause a potential difference between the both electrodes of the capacitance devices 256, 261. When the potential difference between the both electrodes of the capacitance devices 256 and 261 reaches a threshold voltage of the transistors 255, 260, the transistors 255 and 260 turn on.

Then, charges continue to accumulate in the capacitance devices 256 and 261 until they become a steady state.

After the capacitance devices 256 and 261 complete the charge storage into a steady state, the switch 250 is turned off. The switches 251, 252 are kept on. The switches 259, 262 are also kept on. The other switches than the above are all off.

Then, positive electric charges held in the capacitance device 256 flow in the direction of the capacitance device 256 via the switch 252, the transistor 255 and the switch 251. More specifically, the positive electric charges held in the capacitance device 256 flow in the direction of the capacitance device 256 via the switch 252, the source region of the transistor 255, the drain region thereof, and the switch 251. As a result, the potential difference between both the electrodes of the capacitance device 256 are decreasing. This operation is performed until the transistor 255 is turned off. That is, the operation is continued until the electric charges held in the capacitance element 256 become the same value as the threshold voltage of the transistor 255.

In addition, positive electric charges held in the capacitance device 261 flow in the direction of the power supply line 264 via the switch 259, the transistor 260. More specifically, positive electric charges held in the capacitance device 261 flow to the power supply line 264 via a switch 259, the source region of the transistor 260 and the drain region thereof. This operation is performed until the transistor 260 is turned OFF. That is, the operation is continued until the electric charges held in the capacitance device 261 become the same value as the threshold voltage of the transistor 260.

At this time, the threshold voltage of the transistor 255 is held in the capacitance device 256 and the threshold voltage of the transistor 260 is held in the capacitance device 261. Subsequently, in this state, the switches 250, 253 in the pixel 713 are turned on while the other switches than those are turned off. The switch 263 in the bias circuit 714 is turned on while the other switches than those are turned off.

Thereupon, the gate electrode of the transistor 255 is inputted by a signal from the photoelectric converter device 257 through the capacitance device 256. At the same time, the gate electrode of the transistor 260 is inputted by a bias potential $V_b$ from through the capacitance device 261.

At this time, the gate electrode of the transistor 255 is inputted by a value having the signal of from the photoelectric converter device 257 added onto the threshold voltage held on the transistor. The gate electrode of the transistor 260 is inputted by a value having the bias potential added onto the threshold voltage held on the transistor. Namely, the signals to be inputted to the gate electrode of the transistors 255 and 260 are signals to be inputted to gate electrodes of the transistor in addition to the threshold voltage held on transistors 255 and 260. Consequently, it is possible to suppress against the affection of transistor characteristic variation.

Then, the potential on the source region of the transistor 255 becomes an output potential $V_{out}$. The output potential $V_{out}$ is outputted, as a signal having been read by the photoelectric converter device 257, onto the signal line S(i) via the switch 250.

Next, the switch 254 is turned on while the other switches than those are turned off, to initialize the photoelectric converter device 257. More specifically, the charge held by the photoelectric converter device 257 is allowed to flow toward the power line V(i) through the switch 254 such that the potential on an n-channel terminal of the photoelectric converter device 257 becomes equal to the potential on the power line 258. From then on, the above operation is repeated.

The semiconductor device having the above configuration can suppress against the affection of a transistor threshold voltage variation.

The invention can be desirably combined with Embodiments 1-3.

(Embodiment 5)

This embodiment explains an example, different from Embodiments 2 to 4, of an electric circuit to which the invention is applied, by using FIGS. 13 to 16.

Figure 13A:
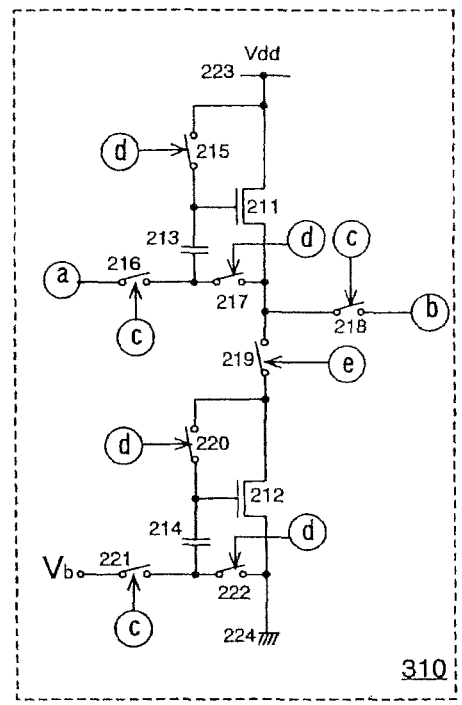
FIGS. 13A and 13B are diagrams illustrating a structure of an electric circuit of the present invention.

In FIG. 13A, 310 is the source follower circuit of FIGS. 1 and 2. Since the circuit configuration and operation of the source follower circuit 310 is similar to that of FIGS. 1 and 2, description is omitted in this embodiment.

The operation of the source follower circuit 310 is to be roughly divided with setting and output operations, as mentioned before. Incidentally, setting operation is an operation to hold predetermined charge on a capacitance element, which corresponds to the operation in FIGS. 1A, B and 2 A. Meanwhile, output operation is an operation to input an input voltage $V_{in}$ and a bias potential $Y_b$ to take out an output potential $V_{out}$, which corresponds to the operation in FIG. 2 B.

In the source follower circuit 310, a terminal a corresponds to the input terminal while a terminal b corresponds to the output terminal. The switches 216, 218, and 221 are controlled by a signal inputted through a terminal c. The switches 215, 217, 220 and 222 are controlled according to a signal inputted through a terminal d. The switch 129 is controlled according to a signal inputted through a terminal e.

Figure 13B:
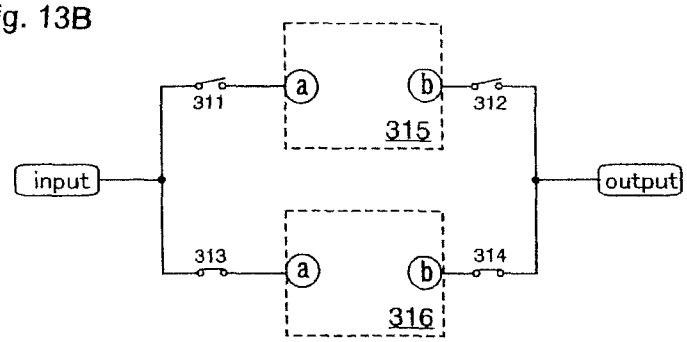

In designing an electric circuit having a source follower circuit 310, it is preferred to arrange at least two source follower circuits 315 and 316 as shown in FIG. 13B. One of the source follower circuits 315 and 316 is preferably to carry out a setting operation while the other is to carry out an output operation. Because this can carry out two operations at the same time, there is no uselessness in operation requiring useless time. Thus, electric circuit operation can be effected at high speed.

For example, in a design using a source follower circuit to a signal-line drive circuit, at least two source follower circuits are preferably arranged on each signal lines. In a design using a source follower circuit to a scanning-line drive circuit, at least two source follower circuits are preferably arranged on each scanning lines. In a design using a source follower circuit on the pixel, at least two source follower circuits are preferably arranged on each pixel.

In FIG. 13B, 311 to 314 are devices having switch functions, preferably transistors are used. When the switches 311 and 312 are on, the switches 313 and 314 are off. When the switches 311 and 312 are off, the switches 313 and 314 are on. In this manner, of the two source follower circuits 315 and 316, one is cause to carry out a setting operation while the other is caused to carry out an output operation. Incidentally, the two source follower circuits 315 and 316 may be controlled by controlling the switches 216 and 218 possessed by the source follower circuit 310 without arranging the switches 311 to 314.

Although, in this embodiment, the region surrounded by the dotted line 315, 316 was assumed corresponding to the source follower circuit, the invention is not limited to this, i.e. the differential amplifier circuit, operational amplifier or the like shown in FIGS. 7 to 10 or the like may be applied.

Figure 14:
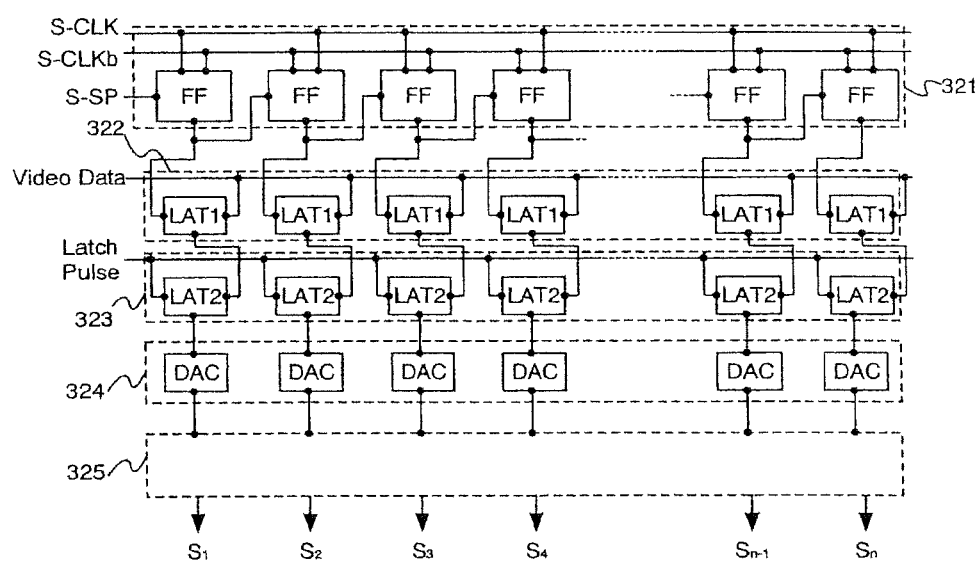
FIG. 14 is a diagram of a signal line drive circuit of the present invention.
Figure 15:
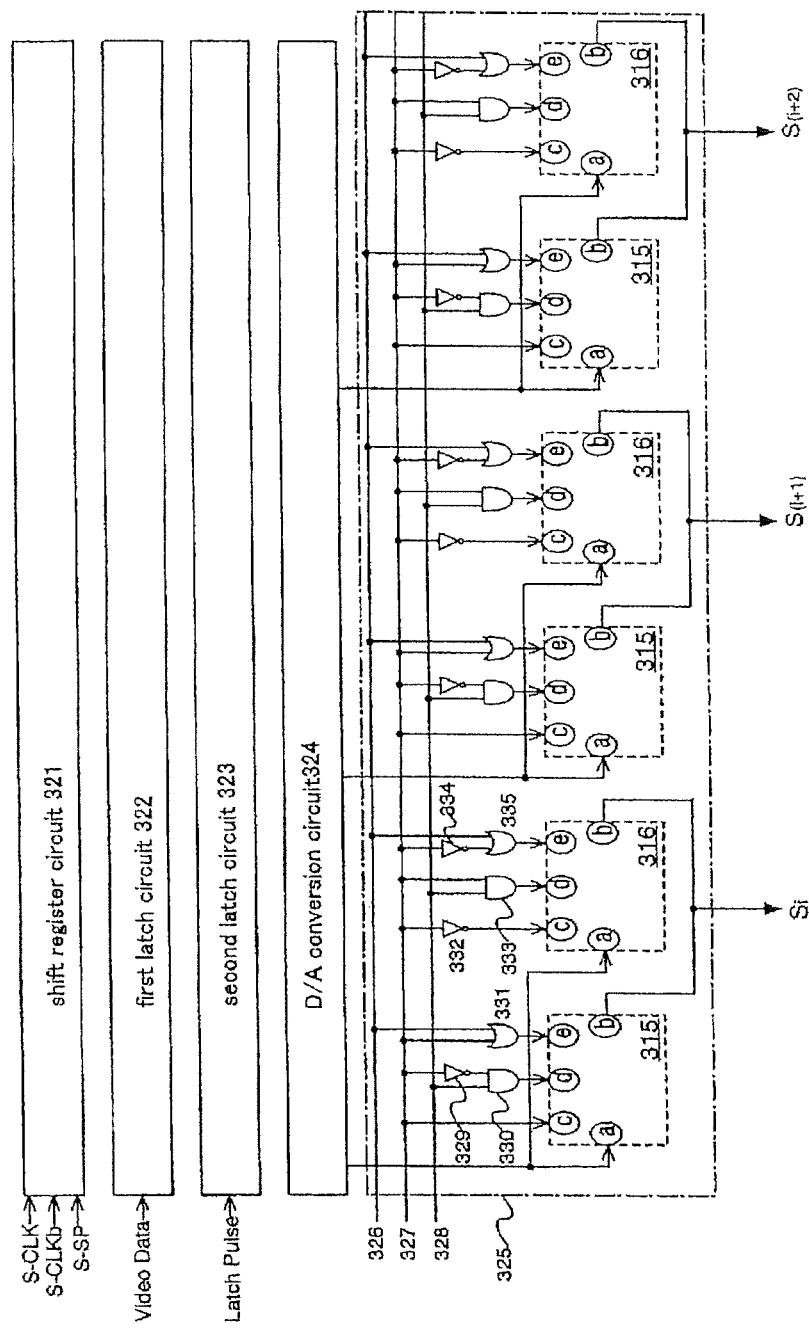
FIG. 15 is a diagram of the signal line drive circuit of the present invention.
Figure 16:
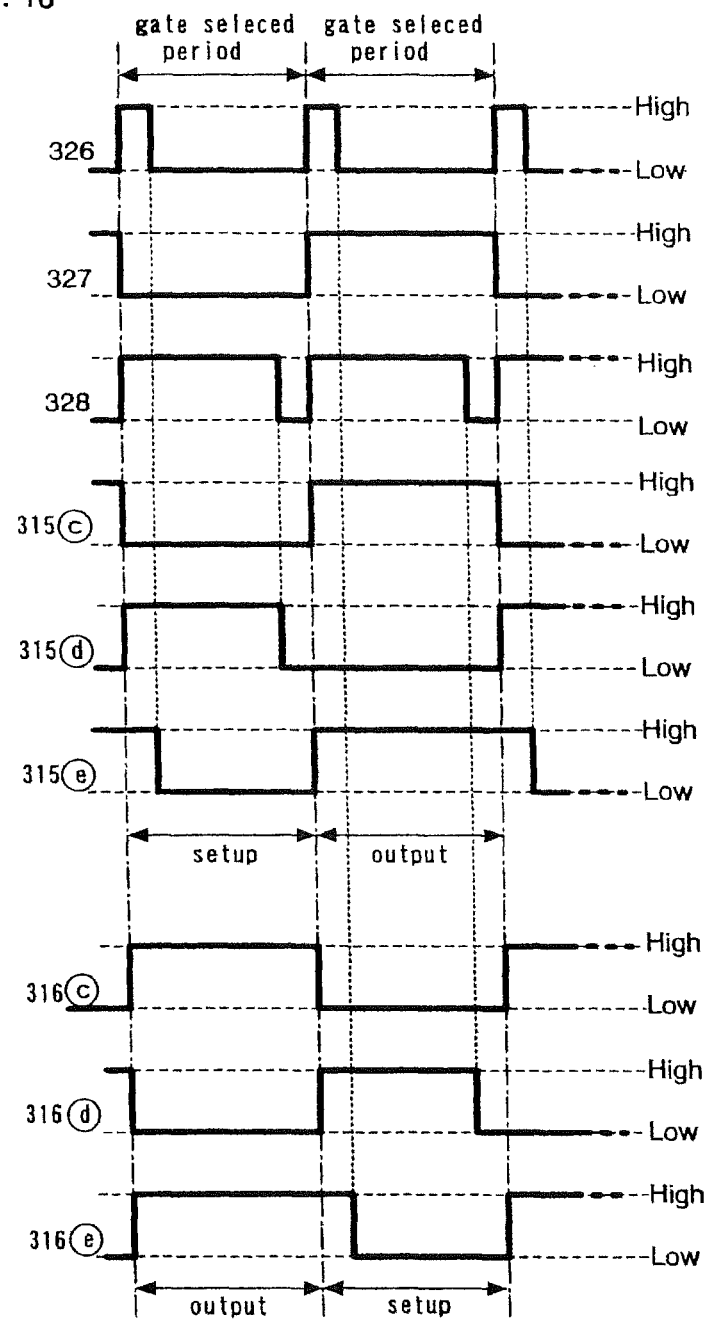
FIG. 16 is a diagram illustrating operations of the signal line drive circuit of the present invention.

This embodiment explains the configuration and operation of a signal-line drive circuit having at least two source follower circuits arranged based on each signal lines, by using FIGS. 14 to 16.

FIG. 14 shows a signal-line drive circuit. The signal-line drive circuit has a sift register 321, a first latch circuit 322, a second latch circuit 323, a D/A converter circuit 324 and a signal amplifier circuit 325.

Note that, in the case that the first latch circuit 322 or second latch circuit 323 is a circuit capable of storing analog data, the D/A converter circuit 324 in many cases is to be omitted. In the case that the data to be outputted onto the signal line is binary, i.e. digital amount, the D/A converter circuit 324 in many cases is to be omitted. Meanwhile, the D/A converter circuit 324, in a certain case, incorporates therein a gamma-correction circuit. In this manner, the signal-line drive circuit is not limited to the configuration of FIG. 17.

Briefly explaining the operation, the shift register 321 is configured using a plurality of columns of flip-flop circuits (FP's) or the like, to, input an input clock signal (S-CLK), a start pulse (SP) and a clock inversion signal (S-CLKb). Sampling pulses are to be sequentially outputted according to the timing of these signals.

The sampling pulse outputted from the shift register 321 is inputted to the first latch circuit 322. The first latch circuit 322 is inputted with a video signal, to hold the video signal on each column according to the input timing of the sampling pulse.

In the first latch circuit 322, when video-signal holding is completed to the last column, a latch pulse is inputted to the second latch circuit 323 during a horizontal retrace period. Thus, the video signals held on the first latch circuit 322 are transferred, at one time, to the second latch circuit 323. Thereafter, the video signals held on the second latch circuit 323 are inputted, simultaneously in an amount of one row, to the D/A converter circuit 324. The signal to be inputted from the D/A converter circuit 324 is inputted to the signal amplifier circuit 325.

While the video signal held on the second latch circuit 323 is being inputted to the D/A converter circuit 324, the shift register 321 again outputs a sampling pulse. From then on, the operation is repeated.

Explanation is made on the configuration of the signal amplifier circuit 325 at around i-th column to (i+2)-th column, or three, signal lines, by using FIG. 15.

The signal amplifier circuit 325 has two source follower circuits 315 and 316 on each column. Each of the source follower circuits 315 and 316 has five terminals, i.e. terminal a to terminal e. The terminal a corresponds to an input terminal of the source follower circuit 315 and 316 while the terminal b corresponds to an output terminal of the source follower circuit 315 and 316. Meanwhile, the switches 216, 218 and 221 are controlled according to a signal inputted through the terminal c while the switches 215, 217, 220 and 222 are controlled according to a signal inputted through the d. Furthermore, the switch 219 is controlled according to a signal inputted through the terminal e.

In the signal amplifier circuit 325 shown in FIG. 15, a logic operator is arranged between the three signal lines, i.e. signal line for initialization 326, a setting signal line 327 and a threshold signal line 328 and the source follower circuit 315 and 316. 329 is an inverter, 330 is an AND, 331 is an OR, 332 is an inverter, 333 is an AND, 334 is an inverter and 335 is an OR. Inputted, to the terminal c to terminal e, is either a signal outputted from the setting signal line 327 or a signal outputted from an output terminal of the above-mentioned logic operators.

Next explained are the signals to be outputted from the three signal lines, i.e. the signal line for initialization 326, the setting signal line 327 and the threshold signal line 328, and the signals to be inputted to the switches through the terminal c to terminal e of the source follower circuit 315 by using FIG. 16.

Note that the switch the signal is to be inputted through the terminal c to terminal e is turned on when a High signal is inputted and off when a Low signal is inputted.

The signals as shown in FIG. 16 are inputted through the three signal lines, i.e. the signal line for initialization 326, the setting signal line 327 and the threshold signal line 328. Furthermore, a signal outputted from the setting signal line 327 is inputted, as it is, to the terminal c of the source follower circuit 315. A signal outputted from an output terminal of the AND 333 is inputted to the terminal d while a signal outputted from an output terminal of the OR 331 is inputted to the terminal e. By doing so, the source follower circuit 315 can be controlled for any one of setting and outputting operations.

Also, a signal outputted from an output terminal of the inverter 332 is inputted to the terminal c of the source follower circuit 316. A signal outputted from an output terminal of the AND 330 is inputted to the terminal d while a signal outputted from the OR is inputted, as it is, to the terminal e. By doing so, the source follower circuit 316 can be controlled for any one of setting and outputting operations.

Incidentally, the signal line drive circuit, in many cases, has a plurality of pixels connected at the end of each signal line thereof. The pixel, in many cases, is to change its state depending upon a voltage inputted through the signal line. This may be a pixel having a liquid crystal device or a light emitting device typified by an organic EL, for example. Besides these, connection is possible with a device of various configurations.

This embodiment can be desirably combined with Embodiments 1 to 4.

(Embodiment 6)

The electronic apparatus using the electric circuit of the invention includes a video camera, a digital camera, a goggle-type display (head-mount display), a navigation system, an audio reproducing apparatus (car audio unit, audio components, etc.), a laptop, a game apparatus, a personal digital assistant (mobile computer, cellular phone, portable game machine or electronic book, etc.), an image reproducing apparatus having a recording medium (specifically, apparatus for reproducing a recording medium such as a Digital Versatile Disk (DVD) etc. and having a display to display an image thereof) and the like. FIGS. 20A to 20H show detailed examples of these electronic apparatus.

FIG. 20A is a display (light emitting apparatus) including a housing 3001, a support base 3002, a display part 3003, a speaker part 3004, a video-input terminal 3005 and the like. The present invention can be used in an electric circuit configuring the display part 3003. Also, the light emitting apparatus of FIG. 20A can be completed by the invention. Because the light emitting apparatus is of a spontaneous emission type, a backlight is not required. Thus, the display part can be made smaller in thickness than the liquid crystal display. Incidentally, the light emitting apparatus includes a display unit for displaying all the pieces of information for personal computers, TV broadcast reception, displaying advertisement and so on.

FIG. 20B is a digital still camera, including a main body 3101, a display part 3102, an image receiving part 3103, operation keys 3104, an external connection port 3105, a shutter 3106 and the like. The invention can be used in an electric circuit configuring the display part 3102. Also, the digital still camera of FIG. 20B is to be completed by the invention.

FIG. 20C is a laptop, including a main body 3201, a housing 3202, a display part 3203, a keyboard 3204, an external connection port 3205, a pointing mouse 3206 and the like. The invention can be used in an electric circuit configuring the display part 3203. Also, the light emitting device of FIG. 20C is to be completed by the invention.

FIG. 20D is a mobile computer, including a main body 3301, a display part 3302, a switch 3303, operation keys 3304, an infrared ray port 3305 and the like. The invention can be used in an electric circuit configuring the display part 3302. Also, the mobile computer of FIG. 20D is completed by the invention.

FIG. 20E is a portable image reproducing apparatus having a recording medium (specifically, DVD reproducing apparatus), including a main body 3401, a housing 3402, a display part-A 3403, a display part-B 3404, a recording-medium (DVD or the like) reading part 3405, operation keys 3406, a speaker part 3407 and the like. The display part-A 3403 is to display, mainly, image information while the display part-B 3404 is to display, mainly, character information. The invention can be used in an electric circuit configuring the display parts A, B 3403, 3404. Incidentally, the image reproducing apparatus having a recording medium includes a home-use game apparatus and the like. Also, the DVD reproducing apparatus of FIG. 20E is to be completed by the invention.

FIG. 20F is a goggle-type display (head-mount display), including a main body 3501, a display part 3502 and an arm part 3503. The invention can be used in an electric circuit configuring the display part 3502. Also, the goggle-type display of FIG. 20F is to be completed by the invention.

FIG. 20G is a video camera, including a main body 3601, a display part 3602, a housing 3603, an external-connection port 3604, a remote-control receiving part 3605, an image receiving part 3606, a battery 3607, a sound input part 3608, operation keys 3609 and the like. The invention can be used in an electric circuit configuring the display part 3602. Also, the video camera of FIG. 20G is to be completed by the invention.

FIG. 20H is a cellular phone, including a main body 3701, a housing 3702, a display part 3703, a sound input part 3704, a sound output part 3705, operation keys 3706, an external-connection port 3707, an antenna 3708 and the like. The invention can be used in an electric circuit configuring the display part 3703. Incidentally, the display part 3703 can suppress the cellular phone from consuming current by displaying white characters on a black background. Also, the cellular phone of FIG. 20H is to be completed by the invention.

Incidentally, if light emitting material will increase light emission brightness in the future, the light containing output image information can be used, by magnifying and projecting by a lens or the like, on a front or rear type projector.

Meanwhile, concerning the above electronic apparatuses, there are increasing cases to display the information distributed through an electronic communication line, such as the Internet or CATV (cable television). Particularly, there are increased occasions to display moving-image information. Because light emitting material has a very high response speed, the light emitting device is preferred for displaying moving-images.

Meanwhile, it is desired for the light emitting device to display information such that a light emitting area is reduced to a possible less extent because the light emitting area consumes power. Accordingly, in the case of using a light emitting device in a display part, mainly for character information, of a personal digital assistant such as particularly a cellular phone or audio reproducing apparatus, it is desired to carry out driving such that character information is formed by a light emitting part with non-emitting part provided as a background.

As described above, the present invention, having an extremely broad scope of application, can be used on an electronic apparatus in every field. Also, the electronic apparatus of the embodiment may use any configuration of the electric circuits and semiconductor devices shown in Embodiments 1 to 5.

The present invention which realizes the effect of controlling the affection of a characteristic variation of TFT greatly contributes to the technology which forms a pixel and a driving circuit on the same substrate by using poly-crystal semiconductor (polysilicon). And an especially excellent effect is brought to the personal digital assignment among the above-mentioned electronics.

Advantage of the Invention

The present invention provides an electric circuit which is arranged such that both electrodes of a capacitance device can hold a voltage between the gate and the source of a specific transistor. Further, the present invention provides an electric circuit which has a function capable of setting a potential difference between both electrodes of a capacitance device so as to be a threshold voltage of a specific transistor.

Moreover, in the present invention, a voltage between the gate and the source of a specific transistor held in a capacitance device is preserved as it is, and a signal voltage (voltage of a video signal, etc.) is inputted to a gate electrode of the transistor. Then, a voltage with the signal voltage added to the voltage between the gate and the source preserved in the capacitance device is inputted to the gate electrode of the transistor. As a result, a value found by adding a threshold voltage of the transistor and the signal voltage is inputted to the gate electrode of the transistor. That is, in the present invention, even if threshold voltages fluctuate among transistors, the value found by adding the threshold value of the transistor and the signal voltage is always inputted to a transistor to which a signal voltage is inputted. Thus, an electric circuit can be provided in which an influence of the variation of threshold values among transistors is suppressed.

Accordingly, other embodiments are within the scope of the following claims.

What is claimed is:
1. A semiconductor device comprising:
a pixel; and
a peripheral circuit,
wherein the pixel comprises
a first line;
a first transistor, a second transistor, and a third transistor;
a first capacitor; and
an element including an anode and a cathode,
wherein the peripheral circuit comprises
a second capacitor; and
a switch including a first terminal and a second terminal, wherein one of terminals of the first capacitor, one of the anode and the cathode, one of a source and a drain of the first transistor, and one of a source and a drain of the third transistor are electrically connected to each other, wherein one of a source and a drain of the second transistor, a gate of the first transistor, and the other of the terminals of the first capacitor are electrically connected to each other, wherein the other of the source and the drain of the third transistor is electrically connected to the first line, wherein the first terminal of the switch is electrically connected to the first line, and wherein the second terminal of the switch is electrically connected to one of terminals of the second capacitor.

2. The semiconductor device according to claim 1, wherein the element is a photoelectric converter device.

3. The semiconductor device according to claim 2 wherein the cathode of the element is electrically connected to the one of the source and the drain of the third transistor.

4. The semiconductor device according to claim 1, further comprising a second line in the pixel,
wherein the other of the source and the drain of the first transistor and the other of the source and the drain of the second transistor are electrically connected to the second line.

5. The semiconductor device according to claim 1, further comprising:
a fourth transistor including a gate, a source, and a drain in the peripheral circuit;
wherein one of the source and the drain of the fourth transistor and the first terminal of the switch are electrically connected to the first line,
wherein the gate of the fourth transistor is electrically connected to the second terminal of the switch and the one of the terminals of the second capacitor, and
wherein the other of the source and the drain of the fourth transistor is electrically connected to the other of the terminals of the second capacitor.

6. A semiconductor device comprising:
a pixel; and
a peripheral circuit,
wherein the pixel comprises
a first line and a second line;
a first transistor, a second transistor, and a third transistor;
a first capacitor; and
an element including an anode and a cathode,
wherein the peripheral circuit comprises
a second capacitor; and
a switch including a first terminal and a second terminal, wherein one of terminals of the first capacitor, one of the anode and the cathode, one of a source and a drain of the first transistor, and one of a source and a drain of the third transistor are electrically connected to each other, wherein one of a source and a drain of the second transistor, a gate of the first transistor, and the other of the terminals of the first capacitor are electrically connected to each other, wherein the other of the source and the drain of the third transistor is electrically connected to the first line, wherein the first terminal of the switch is electrically connected to the first line, wherein the second terminal of the switch is electrically connected to one of terminals of the second capacitor, wherein the other of the source and the drain of the first transistor, the other of the source and the drain of the second transistor, and the other of the source and the drain of the third transistor are electrically connected to the second line.

7. The semiconductor device according to claim 6, wherein the element is a photoelectric converter device.

8. The semiconductor device according to claim 7, wherein the cathode of the element is electrically connected to the one of the source and the drain of the third transistor.

9. The semiconductor device according to claim 6, further comprising:
a third line electrically connected to a gate of the third transistor in the pixel,
wherein a first potential is capable of being supplied to the third line,
wherein a second potential is capable of being supplied to the second line, and
wherein the first potential is different form the second potential.

10. The semiconductor device according to claim 6, further comprising:
a fourth transistor including a gate, a source, and a drain in the peripheral circuit;
wherein one of the source and the drain of the fourth transistor and the first terminal of the switch are electrically connected to the first line,
wherein the gate of the fourth transistor is electrically connected to the second terminal of the switch and the one of the terminals of the second capacitor, and
wherein the other of the source and the drain of the fourth transistor is electrically connected to the other of the terminals of the second capacitor.

11. An electric apparatus comprising:
the semiconductor device according to claim 1,
at least one of a display part, an image receiving part, an operation keys, and a speaker part.

* * * * *